(12) United States Patent
Cho

(10) Patent No.: US 11,272,135 B2
(45) Date of Patent: Mar. 8, 2022

(54) METHODS OF OPERATING IMAGE SENSORS AND IMAGE SENSORS PERFORMING THE SAME

(71) Applicant: Samsung Electronics Co., Ltd., Suwon-si (KR)

(72) Inventor: Kyu-Ik Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 31 days.

(21) Appl. No.: 16/663,770

(22) Filed: Oct. 25, 2019

(65) Prior Publication Data

US 2020/0260037 A1 Aug. 13, 2020

(30) Foreign Application Priority Data

Feb. 12, 2019 (KR) ........................ 10-2019-0015939

(51) Int. Cl.
*H04N 5/378* (2011.01)
*H03M 1/12* (2006.01)
*H03M 1/56* (2006.01)

(52) U.S. Cl.
CPC .......... *H04N 5/378* (2013.01); *H03M 1/1245* (2013.01); *H03M 1/56* (2013.01)

(58) Field of Classification Search
CPC .... H04N 3/1575; H04N 5/378; H04N 5/3742; H04N 5/3743; H04N 5/3745; H04N 5/376; H04N 5/3765; H04N 5/3355; H04N 5/37452; H04N 5/37455
See application file for complete search history.

(56) References Cited

U.S. PATENT DOCUMENTS

| | | | |
|---|---|---|---|
| 9,166,614 B2 | 10/2015 | Higuchi et al. | |
| 9,307,173 B2 | 4/2016 | Takamiya et al. | |
| 9,635,298 B2 | 4/2017 | Nakamura et al. | |
| 9,667,899 B2 | 5/2017 | Gou et al. | |
| 9,912,883 B1 | 3/2018 | Lee | |
| 9,986,172 B2 | 5/2018 | Aibara | |
| 10,015,422 B1 | 7/2018 | Kim | |
| 2002/0118289 A1* | 8/2002 | Choi | H04N 5/378 348/308 |
| 2007/0194962 A1* | 8/2007 | Asayama | H03M 1/66 341/144 |
| 2007/0216564 A1* | 9/2007 | Koseki | H04N 5/374 341/155 |

(Continued)

*Primary Examiner* — Abdelaaziz Tissire
(74) *Attorney, Agent, or Firm* — Myers Bigel, P.A.

(57) ABSTRACT

A method of operating an image sensor includes generating an analog pixel signal, including a reset component and an image component, based on incident light received by a pixel in the image sensor. Operations are performed to repeatedly sample the reset component of the analog pixel signal using a ramp signal, during a first time interval, and then repeatedly sample the image component of the analog pixel signal using the ramp signal, during a second time interval subsequent to the first time interval. A digital signal corresponding to an effective image component of the incident light is then generated. This digital signal is based on the repeatedly sampled reset component of the analog pixel signal and the repeatedly sampled image component of the analog pixel signal. In addition, during both the first and second time intervals, the ramp signal decreases in magnitude and increases in magnitude.

19 Claims, 23 Drawing Sheets

(56) References Cited

U.S. PATENT DOCUMENTS

| | | | | |
|---|---|---|---|---|
| 2009/0066554 A1* | 3/2009 | Lim | .................. | H03M 1/144 |
| | | | | 341/155 |
| 2011/0019047 A1* | 1/2011 | Suzuki | .................. | H04N 5/374 |
| | | | | 348/302 |
| 2011/0074994 A1* | 3/2011 | Wakabayashi | ...... | H03M 1/1023 |
| | | | | 348/302 |
| 2011/0279723 A1* | 11/2011 | Takamiya | ............ | H04N 5/3745 |
| | | | | 348/308 |
| 2011/0304755 A1* | 12/2011 | Kondo | .................. | H04N 5/378 |
| | | | | 348/294 |
| 2012/0127356 A1* | 5/2012 | Matsuura | ............. | H04N 5/3577 |
| | | | | 348/313 |
| 2012/0138775 A1* | 6/2012 | Cheon | .................. | H04N 5/378 |
| | | | | 250/208.1 |
| 2014/0036124 A1* | 2/2014 | Higuchi | ............... | H04N 5/3658 |
| | | | | 348/302 |
| 2014/0078360 A1* | 3/2014 | Park | ...................... | H04N 5/355 |
| | | | | 348/294 |
| 2015/0029372 A1* | 1/2015 | Lee | .................... | H03M 1/0624 |
| | | | | 348/308 |
| 2015/0042859 A1* | 2/2015 | Lee | .................... | H04N 5/3575 |
| | | | | 348/311 |
| 2017/0195603 A1 | 7/2017 | Kawazu et al. | | |
| 2018/0198996 A1 | 7/2018 | Ha et al. | | |
| 2018/0359443 A1* | 12/2018 | Cho | ...................... | H04N 5/378 |
| 2021/0274121 A1* | 9/2021 | Kim | .................... | H04N 5/3745 |

\* cited by examiner

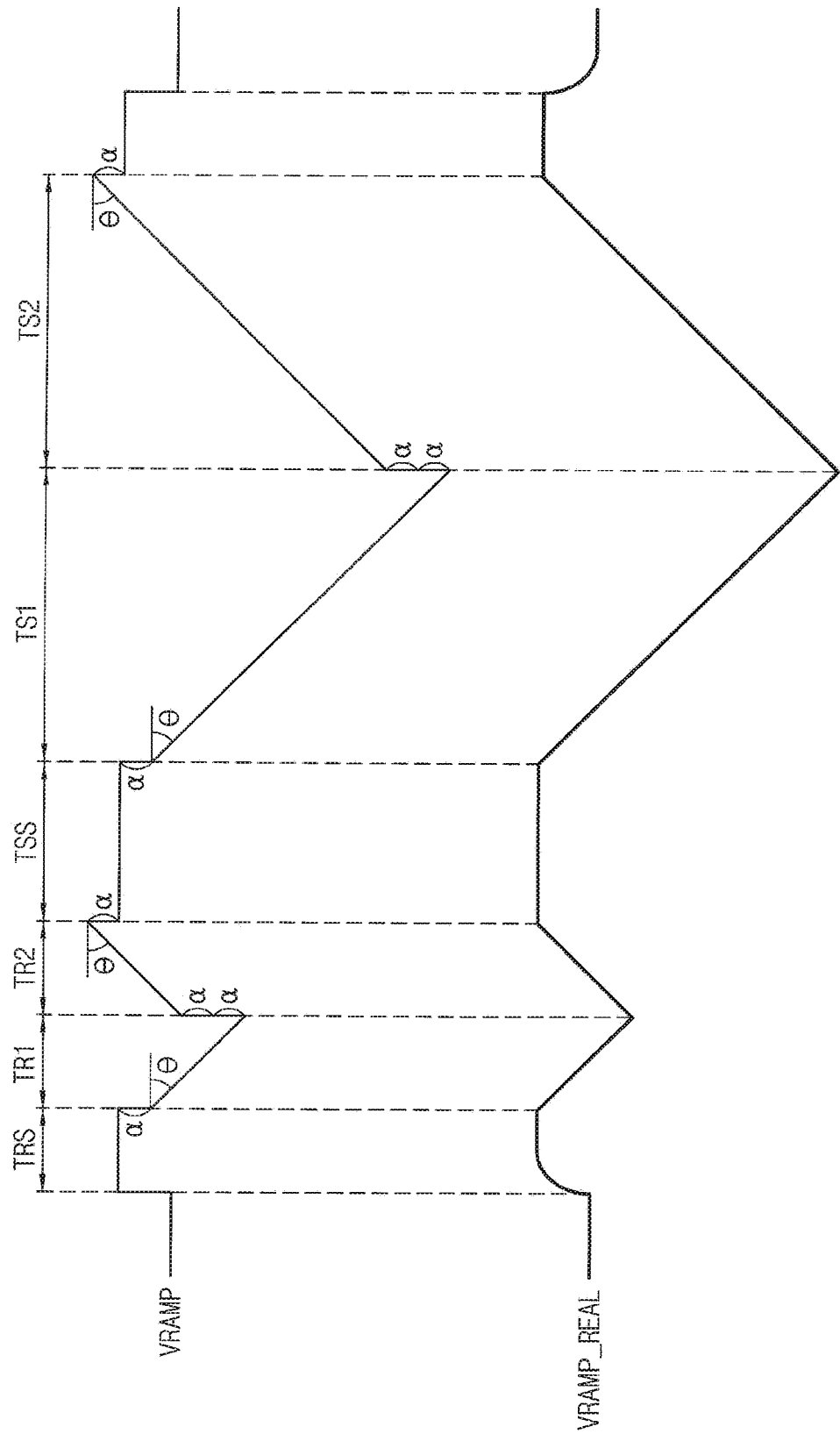

600

METHODS OF OPERATING IMAGE SENSORS AND IMAGE SENSORS PERFORMING THE SAME

REFERENCE TO PRIORITY APPLICATION

This application claims priority under 35 USC § 119 to Korean Patent Application No. 10-2019-0015939, filed Feb. 12, 2019, the disclosure of which is hereby incorporated herein by reference.

BACKGROUND

1. Technical Field

Example embodiments relate generally to image sensors and, more particularly, to methods of operating image sensors, and image sensors performing the methods.

2. Description of the Related Art

A complementary metal oxide semiconductor (CMOS) image sensor is an image pickup device manufactured using CMOS processes. The CMOS image sensor typically has lower manufacturing costs and smaller pixel size than conventional charge coupled device (CCD) image sensors that typically utilize relatively high-voltage analog circuits. Accordingly, CMOS-type image sensors may have lower power consumption requirements relative to CCD-type image sensors. Moreover, with the continued improvement in performance of CMOS image sensors, CMOS image sensors are becoming more widely used in mobile electronic devices such as smart phones, tablet personal computers (PCs), and digital cameras. To implement a CMOS image sensor with high speed and high resolution, the CMOS image sensor typically requires an analog-to-digital converter (ADC) with high speed and a large number of unit pixels. In addition, various research projects have been undertaken to provide techniques of reducing the noise and the settling time of a ramp signal within a CMOS image sensor.

SUMMARY

At least one example embodiment of the present disclosure provides a method of operating an image sensor capable of performing a high speed operation with a single slope analog-to-digital conversion and a multiple sampling.

At least one example embodiment of the present disclosure provides an image sensor performing the method.

According to example embodiments, in a method of operating an image sensor, an analog pixel signal including a reset component and an image component is generated based on incident light. During a first time interval, the reset component of the analog pixel signal is sampled two or more times based on a ramp signal. A level of the ramp signal falls and rises (i.e., decreases and increases) with a constant slope during the first time interval. An offset of the ramp signal decreases and increases by a constant magnitude during the first time interval. During a second time interval subsequent to the first time interval, the image component of the analog pixel signal is sampled based on the ramp signal. A digital signal corresponding to an effective image component of the incident light is generated based on the sampled reset component and the sampled image component.

According to example embodiments, in a method of operating an image sensor, an analog pixel signal including a reset component and an image component is generated based on incident light. During a first time interval, the reset component of the analog pixel signal is sampled based on a ramp signal. During a second time interval subsequent to the first time interval, the image component of the analog pixel signal is sampled two or more times based on the ramp signal. A level of the ramp signal falls and rises with a constant slope during the second time interval. An offset of the ramp signal decreases and increases by a constant magnitude during the second time interval. A digital signal corresponding to an effective image component of the incident light is generated based on the sampled reset component and the sampled image component.

According to example embodiments, an image sensor includes a pixel array, a ramp signal generator, a first offset generator, a second offset generator and an analog-to-digital conversion unit. The pixel array generates an analog pixel signal including a reset component and an image component based on incident light. The ramp signal generator generates a ramp signal a level of which falls and rises with a constant slope. The first offset generator decreases an offset of the ramp signal by a constant magnitude. The second offset generator increases the offset of the ramp signal by the constant magnitude. The analog-to-digital conversion unit samples the reset component of the analog pixel signal two or more times based on the ramp signal during a first time interval, samples the image component of the analog pixel signal based on the ramp signal during a second time interval subsequent to the first time interval, and generates a digital signal corresponding to an effective image component of the incident light based on the sampled reset component and the sampled image component. The level of the ramp signal falls and rises with the constant slope during the first time interval. The offset of the ramp signal decreases and increases by the constant magnitude during the first time interval.

In the method of operating the image sensor and the image sensor according to example embodiments, one analog pixel signal may be sampled a plurality of times based on the multiple sampling scheme in performing the single slope analog-to-digital conversion, and thus the noise may be reduced. In addition, the analog-to-digital conversion may be performed based on the ramp signal in which the level is repeatedly decreased and increased with the constant slope and the offset is repeatedly decreased and increased by the constant magnitude, and thus the settling time of the ramp signal may be reduced and the high speed operation may be performed.

According to still further embodiments of the invention, a method of operating an image sensor can include an operation to generate an analog pixel signal, including a reset component and an image component, based on incident light received by a pixel in the image sensor. An operation is performed to repeatedly sample the reset component of the analog pixel signal using a ramp signal, during a first time interval, and then an operation is performed to repeatedly sample the image component of the analog pixel signal using the ramp signal, during a second time interval subsequent to the first time interval. A digital signal corresponding to an effective image component of the incident light is then generated, based on the repeatedly sampled reset component of the analog pixel signal and the repeatedly sampled image component of the analog pixel signal. Preferably, during the first time interval, the ramp signal decreases in magnitude (e.g., with a constant slope) and increases in magnitude (e.g., with a constant slope). And, in some embodiments of the invention, the ramp signal may, during the first time interval, decrease in magnitude according to a first series of stair-step adjustments and increase in magnitude according to a second series of stair-step adjustments. In other embodiments of the invention, the operation to repeatedly sample the reset component may include generating a first count during the first time interval, and the operation to repeatedly sample the image component may include generating a second count during the second time interval. And, based on these embodiments of the invention, the digital signal corresponding to an effective image component of the incident light is proportional to a difference between the first and second counts. Moreover, the operation to repeatedly sample the reset component can include generating a first digital count having a magnitude proportional to a length of time during which the reset component of the analog pixel signal is greater than (or less than) a magnitude of the ramp signal during the first time interval. Likewise, the operation to repeatedly sample the image component can include generating a second digital count having a magnitude proportional to a length of time during which the image component of the analog pixel signal is greater than (or less than) a magnitude of the ramp signal during the second time interval. These first and second digital counts may be at least temporarily stored within a counter(s)/register(s).

BRIEF DESCRIPTION OF THE DRAWINGS

Illustrative, non-limiting example embodiments will be more clearly understood from the following detailed description taken in conjunction with the accompanying drawings.

FIGS. 8 and 9 are timing diagrams for describing an operation of sampling the reset component and the image component of the analog pixel signal in FIGS. 6 and 7.

DETAILED DESCRIPTION OF THE EMBODIMENTS

Figure 1:
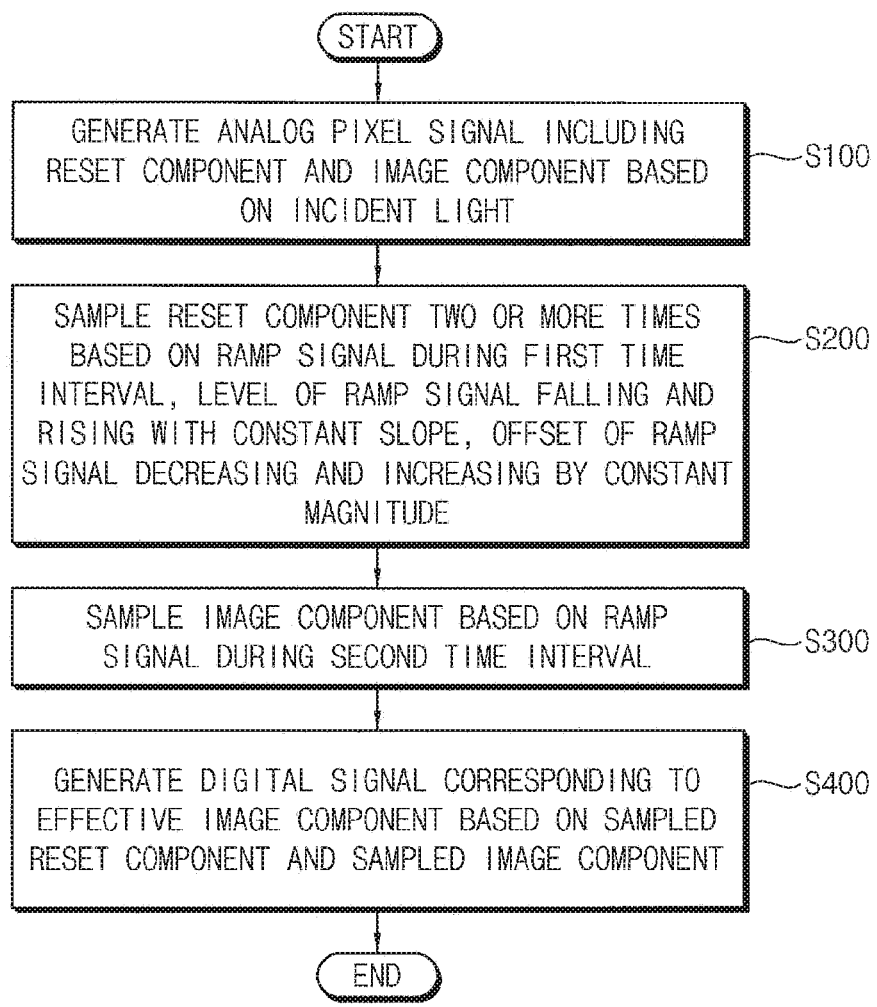
FIG. 1 is a flowchart illustrating a method of operating an image sensor according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of operating an image sensor according to example embodiments. Referring to FIG. 1, a method of operating an image sensor according to example embodiments is performed or executed by an image sensor including a pixel array and an analog-to-digital conversion unit that is connected to a plurality of columns of the pixel array and performs an analog-to-digital conversion operation based on a ramp signal. Hereinafter, the method of operating the image sensor according to some example embodiments will be described based on a complementary metal-oxide semiconductor (CMOS) image sensor. However, the method of operating the image sensor according to some example embodiments may be applied to drive a charge-coupled device (CCD) image sensor. Detailed configurations of a CMOS image sensor and a unit pixel will be described below with reference to FIGS. 2 and 22.

In the method of operating the image sensor according to example embodiments, an analog pixel signal including a reset component and an image component is generated based on incident light (step S100). As will be described with reference to FIG. 2, one analog pixel signal may be generated from one unit pixel included in a multi-pixel array.

The reset component of the analog pixel signal is sampled two or more times based on a ramp signal during a first time interval (step S200). A level of the ramp signal falls and rises with a constant slope during the first time interval, and an offset of the ramp signal decreases and increases by a constant magnitude during the first time interval. The first time interval may be a reset sampling duration or period for sampling the reset component. In addition, the sampling operation for the reset component may be a multiple sampling operation in which one analog pixel signal is sampled multiple times.

The image component of the analog pixel signal is sampled based on the ramp signal during a second time interval subsequent to the first time interval (step S300). The second time interval may be an image sampling duration or period for sampling the image component.

In some example embodiments, as will be described with reference to FIGS. 6 through 16, the number of times of sampling the image component may be substantially equal to the number of times of sampling the reset component. In other words, the sampling operation for the image component may also be the multiple sampling operation. In other example embodiments, as will be described with reference to FIGS. 17 and 18, the number of times of sampling the image component may be less than the number of times of sampling the reset component. In still other example embodiments, as will be described with reference to FIGS. 19, 20 and 21, the number of times of sampling the image component may be greater than the number of times of sampling the reset component.

A digital signal corresponding to an effective image component of the incident light is generated based on the sampled reset component and the sampled image component (step S400). For example, a difference between the sampled reset component and the sampled image component may be output as the digital signal.

In the method of operating the image sensor according to example embodiments, one analog pixel signal may be sampled a plurality of times based on the multiple sampling scheme, and thus the noise may be reduced. Typically, the noise may be reduced in proportion to the number of times of the sampling operation. In addition, the analog-to-digital conversion operation may be performed based on the ramp signal in which the level is repeatedly reduced and increased with the constant slope and the offset is repeatedly decreased and increased by the constant magnitude, and thus the settling time of the ramp signal may be reduced and the high speed operation may be performed.

Figure 2:
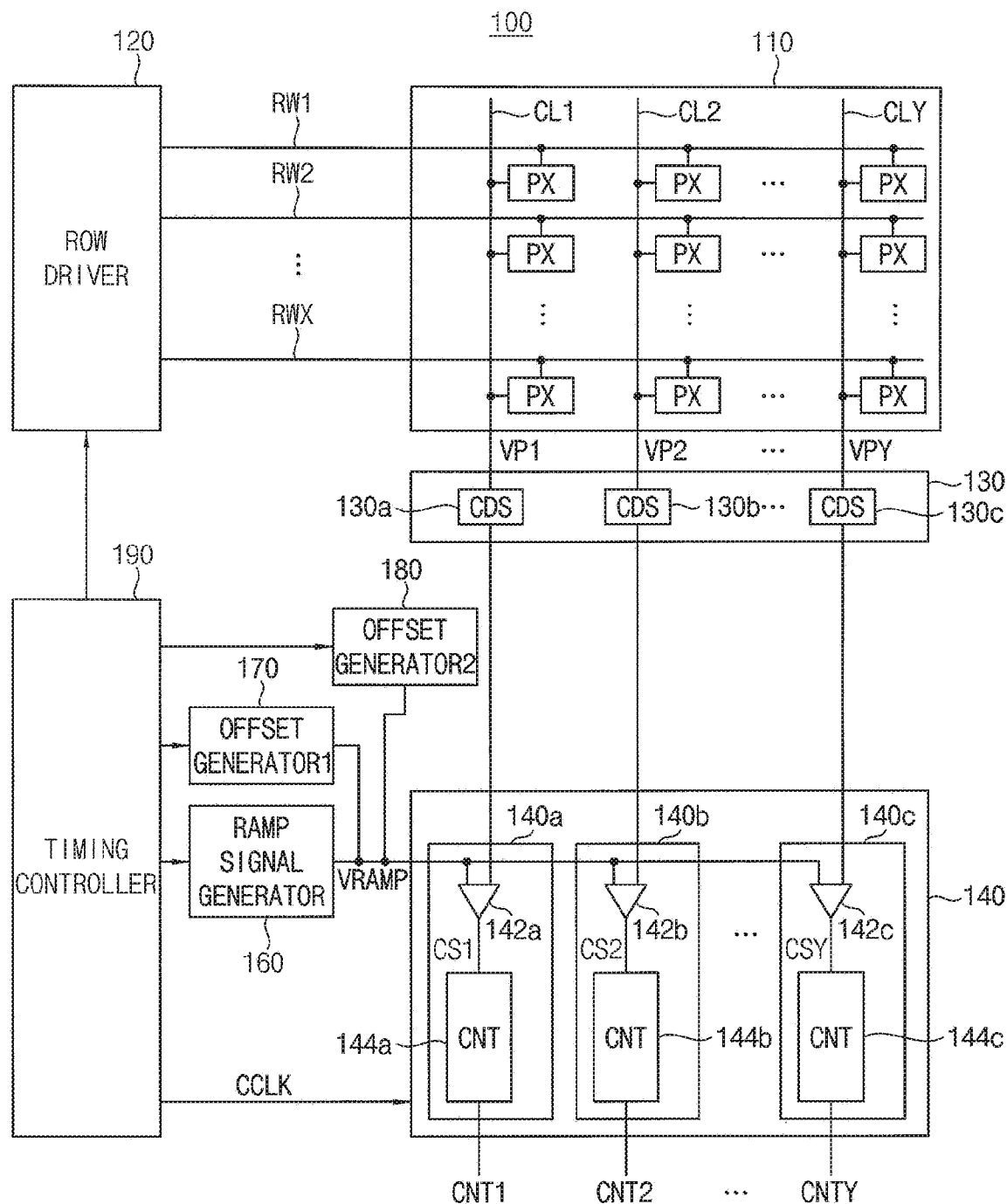
FIG. 2 is a block diagram illustrating an image sensor according to example embodiments.

FIG. 2 is a block diagram illustrating an image sensor according to example embodiments. Referring to FIG. 2, an image sensor 100 includes a pixel array 110, an analog-to-digital conversion (ADC) unit 140, a ramp signal generator 160, a first offset generator 170 and a second offset generator 180. The image sensor 100 may further include a row driver 120, a correlated double sampling (CDS) unit 130 and a timing controller 190.

In some example embodiments, the image sensor 100 may be classified as a front side illumination (FSI) image sensor or a back side illumination (BSI) image sensor depending on whether a light receiving surface is the front or back side of a substrate. The pixel array 110 includes a plurality of unit pixels PX that are arranged in a matrix formation. Each of the plurality of unit pixels PX may be connected to a respective one of a plurality of rows RW1, RW2, ..., RWX and a respective one of a plurality of columns CL1, CL2, ..., CLY, where each of X and Y is a natural number greater than or equal to two. The pixel array 110 generates a plurality of analog pixel signals VP1, VP2, ..., VPY based on incident light. Each of the plurality of analog pixel signals VP1~VPY includes a reset component and an image component. A configuration and an operation of each unit pixel will be described with reference to FIG. 22.

The row driver 120 may be connected to the plurality of rows RW1~RWX of the pixel array 110. The row driver 120 may generate driving signals to drive the plurality of rows RW1~RWX. For example, the row driver 120 may drive the plurality of unit pixels PX included in the pixel array 110 row by row.

The correlated double sampling unit 130 may include a plurality of correlated double sampling circuits (CDSs) 130a, 130b, ..., 130c. The plurality of correlated double sampling circuits 130a~130c may be connected to the plurality of columns CL1~CLY of the pixel array 110. The plurality of correlated double sampling circuits 130a~130c may perform a correlated double sampling operation on the plurality of analog pixel signals VP1~VPY output from the pixel array 110. For example, the first correlated double sampling circuit 130a may be connected to the first column CL1 and may perform the correlated double sampling operation on the first analog pixel signal VP1 output from the first column CL1.

The analog-to-digital conversion unit 140 includes a plurality of analog-to-digital converters 140a, 140b, ..., 140c. The plurality of analog-to-digital converters 140a~140c are connected to the plurality of columns CL1~CLY of the pixel array 110 via the plurality of correlated double sampling circuits 130a~130c. The plurality of analog-to-digital converters 140a~140c perform a column analog-to-digital conversion operation that converts the plurality of analog pixel signals VP1~VPY (e.g., a plurality of correlated double sampled analog pixel signals output from the plurality of correlated double sampling circuits 130a~130c) into a plurality of digital signals CNT1, CNT2, ..., CNTY in parallel (e.g., simultaneously or concurrently). For example, the first analog-to-digital converter 140a may be connected to the first column CL1 via the first correlated double sampling circuit 130a and may convert the first analog pixel signal VP1 (e.g., the correlated double sampled first analog pixel signal output from the first correlated double sampling circuit 130a) into the first digital signal CNT1.

Each of the plurality of analog-to-digital converters 140a~140c may include a respective one of a plurality of comparators 142a, 142b, ..., 142c and a respective one of a plurality of counters (CNTs) 144a, 144b, ..., 144c. The plurality of comparators 142a~142c may generate a plurality of comparison signals CS1, CS2, ..., CSY, and the plurality of counters 144a~144c may generate a plurality of digital signals CNT1, CNT2, CNTY. For example, the first analog-to-digital converter 140a may include the first comparator 142a and the first counter 144a. The first comparator 142a may compare a ramp signal VRAMP with the first analog pixel signal VP1 (e.g., the correlated double sampled first analog pixel signal output from the first correlated double sampling circuit 130a) to generate the first comparison signal CS1. The first counter 144a may count an activation time interval (e.g., a level transition timing) of the first comparison signal CS1 based on a count clock signal CCLK to generate the first digital signal CNT1.

Operations of the correlated double sampling unit 130 and the analog-to-digital conversion unit 140 may be performed on the plurality of unit pixels PX included in the pixel array 110 on a row by row basis. For example, the correlated double sampling operation and the analog-to-digital conversion operation may be performed on the analog pixel signals VP1~VPY that are generated from pixels connected to the first row RW1, and then the correlated double sampling operation and the analog-to-digital conversion operation may be sequentially repeated on the analog pixel signals VP1~VPY that are generated from pixels connected to the second row RW2 through the analog pixel signals VP1~VPY that are generated from pixels connected to the X-th row RWX. The digital signals CNT1~CNTY corresponding to the first row RW1 through the digital signals CNT1~CNTY corresponding to the X-th row RWX may be sequentially output. In other words, the digital signals CNT1~CNTY output from the image sensor 100 at once may correspond to signals generated from a single row of the pixel array 110.

The ramp signal generator 160 generates the ramp signal VRAMP, which has a magnitude that may fall and rise with a constant slope in some embodiments. A configuration and an operation of the ramp signal generator 160 will be described with reference to FIGS. 3, 4A and 4B. The first offset generator 170 increases and decreases an offset of the ramp signal VRAMP by a constant magnitude. For example, the first offset generator 170 may be turned on at an initial operation time to increase the offset of the ramp signal VRAMP, and may be turned off when the offset of the ramp signal VRAMP is to be decreased by the constant magnitude with respect to an initial offset. For example, the constant magnitude may be changeable. A configuration of the first offset generator 170 will be described with reference to FIGS. 3 and 5.

The second offset generator 180 increases and decreases the offset of the ramp signal VRAMP by the constant magnitude. For example, the second offset generator 180 may be turned off at the initial operation time, and may be turned on when the offset of the ramp signal VRAMP is to be increased by the constant magnitude with respect to the initial offset. A configuration of the second offset generator 180 may be substantially the same as that of the first offset generator 170.

The image sensor 100 and the analog-to-digital conversion unit 140 may perform or execute the method of operating the image sensor as described with reference to FIG. 1, using the ramp signal generator 160, the first offset generator 170 and the second offset generator 180. For example, the analog-to-digital conversion unit 140 samples the reset component of the analog pixel signals VP1~VPY two or more times based on the ramp signal VRAMP during a first time interval, sample the image component of the analog pixel signals VP1~VPY based on the ramp signal VRAMP during a second time interval subsequent to the first time interval, and generates the digital signals CNT1~CNTY corresponding to an effective image component based on the sampled reset component and the sampled image component. The level of the ramp signal VRAMP falls and rises with the constant slope during the first time interval, and the offset of the ramp signal VRAMP decreases and increases by the constant magnitude during the first time interval. In addition, the image sensor 100 and the analog-to-digital conversion unit 140 may perform or execute a method of operating an image sensor as will described with reference to FIG. 19, using the ramp signal generator 160, the first offset generator 170 and the second offset generator 180.

The timing controller 190 may control overall operation timings of the image sensor 100. For example, the timing controller 190 may control operations of the row driver 120, the ramp signal generator 160, the first offset generator 170, the second offset generator 180, etc. and may generate control signals including the count clock signal CCLK, etc.

Figure 3:
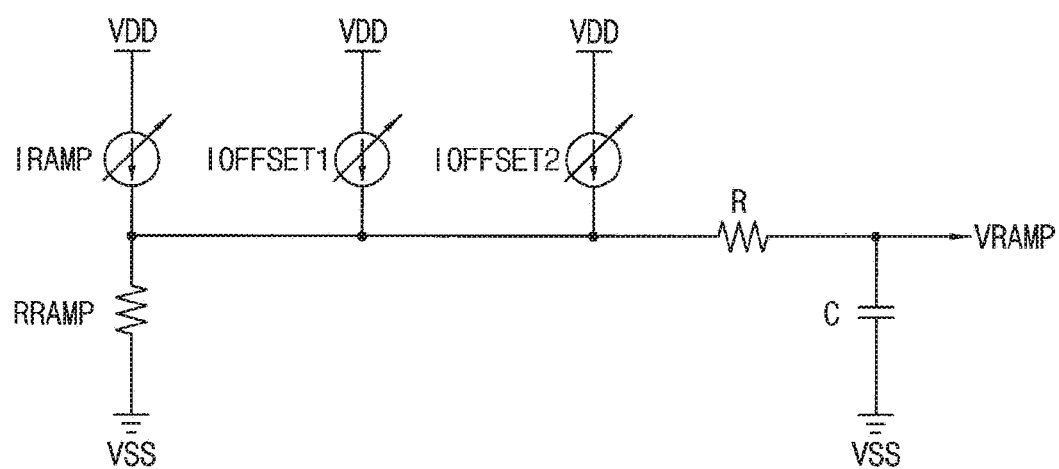
FIG. 3 is a circuit diagram illustrating an example of a ramp signal generator and offset generators included in an image sensor according to example embodiments.

FIG. 3 is a circuit diagram illustrating an example of a ramp signal generator and offset generators included in an image sensor according to example embodiments. Referring now to FIGS. 2 and 3, the ramp signal generator 160 may include a variable ramp current source IRAMP and a ramp resistor RRAMP. The ramp signal generator 160 may further include a resistor R and a capacitor C. The variable ramp current source IRAMP and the ramp resistor RRAMP may be connected in series between a power supply voltage VDD and a ground voltage VSS. The resistor R may be connected between a node between the variable ramp current source IRAMP and the ramp resistor RRAMP and an output terminal for outputting the ramp signal VRAMP. The capacitor C may be connected between the output terminal and the ground voltage VSS.

The first offset generator 170 may include a first variable offset current source IOFFSET1 connected in parallel with the variable ramp current source IRAMP between the power supply voltage VDD and the ramp resistor RRAMP. Similarly, the second offset generator 180 may include a second variable offset current source IOFFSET2 connected in parallel with the variable ramp current source IRAMP and the first variable offset current source IOFFSET1 between the power supply voltage VDD and the ramp resistor RRAMP.

As described with reference to FIG. 2, to generate the ramp signal VRAMP whose level falls and rises with the constant slope, the ramp signal generator 160 may be implemented with the variable ramp current source IRAMP. In addition, to decrease and increase the offset of the ramp signal VRAMP by the constant magnitude, the image sensor 100 may be implemented with the first offset generator 170 and the second offset generator 180. Further, the first offset generator 170 and the second offset generator 180 may be implemented with the first variable offset current source IOFFSET1 and the second variable offset current source IOFFSET2, respectively, so that the constant magnitude is changeable.

Figure 4A:
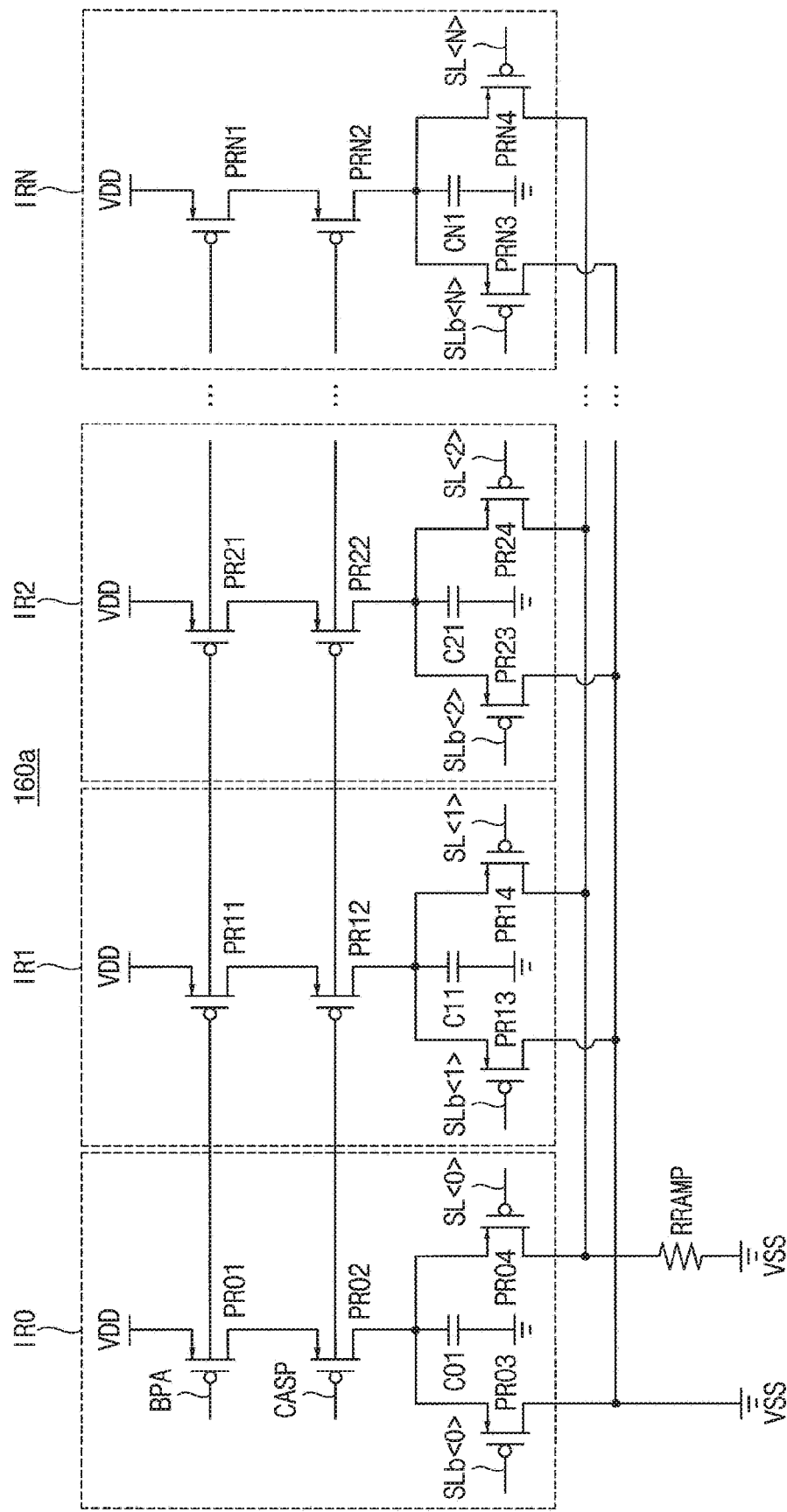
FIG. 4A is a circuit diagram illustrating a configuration of the ramp signal generator in FIG. 3.
Figure 4B:
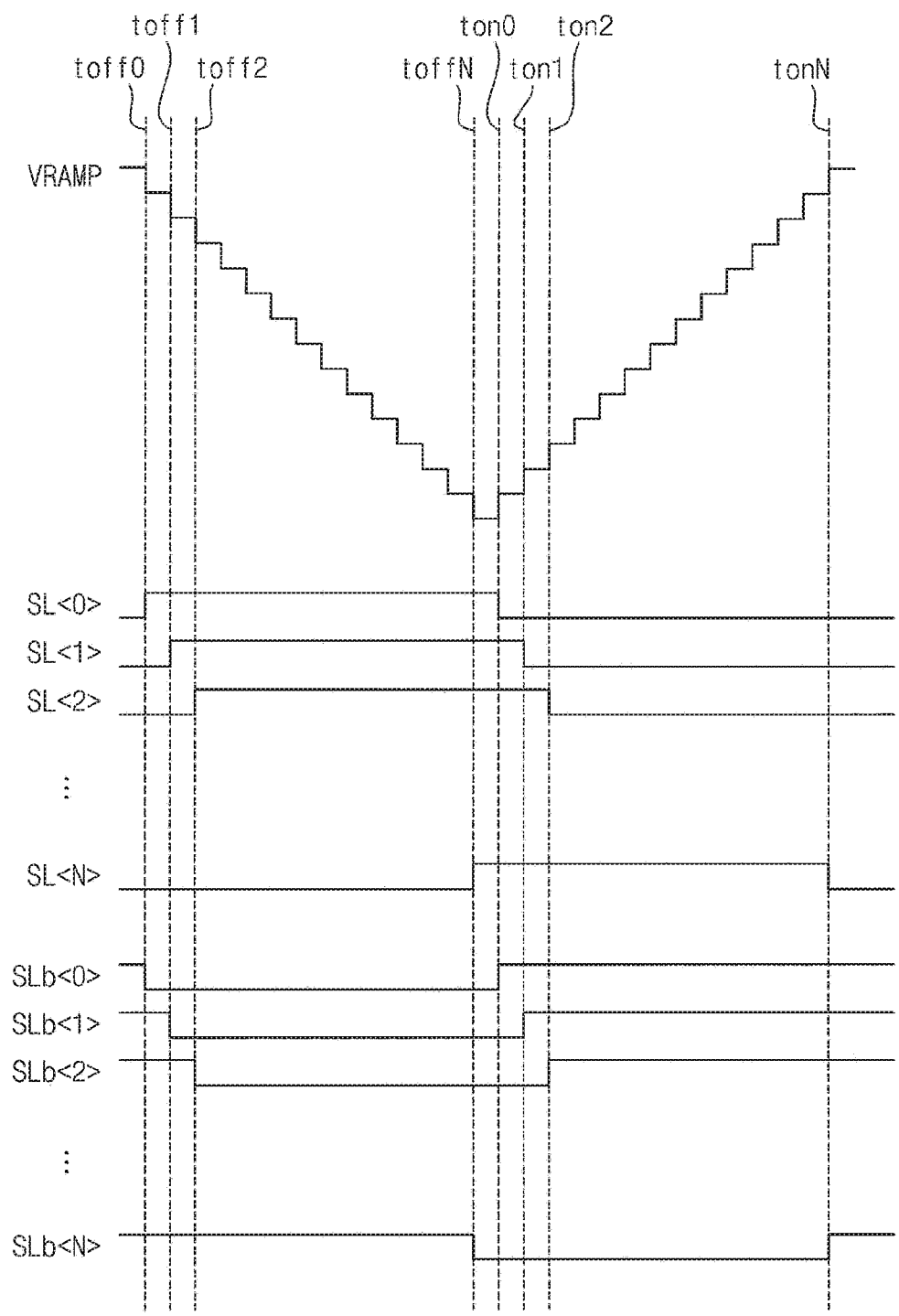
FIG. 4B is a timing diagram illustrating an operation of the ramp signal generator of FIG. 4A.

FIG. 4A is a circuit diagram illustrating a configuration of the ramp signal generator in FIG. 3. FIG. 4B is a timing diagram illustrating an operation of the ramp signal generator of FIG. 4A. Referring to FIGS. 3 and 4A, a ramp signal generator 160a may include a plurality of ramp current sources IR0, IR1, IR2, . . . , IRN connected in parallel and the ramp resistance RRAMP. The plurality of ramp current sources IR0~IRN connected in parallel may correspond to the variable ramp current source IRAMP in FIG. 3. In other words, the variable ramp current source IRAMP may include the plurality of ramp current sources IR0~IRN connected in parallel.

The ramp current source IR0 may include transistors PRO1, PRO2, PRO3 and PRO4 and a capacitor C01, and may operate in response to control signals BPA, CASP, SLb<0> and SL<0>. The transistors PRO1 and PRO2 and the capacitor C01 may be connected in series between the power supply voltage VDD and the ground voltage VSS. The transistor PRO3 may be connected between a node between the transistor PRO2 and the capacitor C01 and the ground voltage VSS. The transistor PRO4 and the ramp resistance RRAMP may be connected in series between the node between the transistor PRO2 and the capacitor C01 and the ground voltage VSS. The control signals BPA, CASP, SLb<0> and SL<0> may be applied to gate electrodes of the transistors PRO1, PRO2, PRO3 and PRO4, respectively.

The remaining ramp current sources IR1~IRN may have substantially the same configuration as the ramp current source IR0. For example, the ramp current source IR1 may include transistors PR11, PR12, PR13 and PR14 and a capacitor C11, and may operate in response to control signals BPA, CASP and SLb<1>, SL<1>. The ramp current source IR2 may include transistors PR21, PR22, PR23 and PR24 and a capacitor C21, and may operate in response to control signals BPA, CASP and SLb<2>, SL<2>. The ramp current source IRN may include transistors PRN1, PRN2, PRN3 and PRN4 and a capacitor CN1, and may operate in response to control signals BPA, CASP and SLb<N>, SL<N>.

Referring now to FIGS. 4A and 4B, the plurality of ramp current sources IR0~IRN may be sequentially turned off when the level of the ramp signal VRAMP is to be decreased by a constant slope, and may be sequentially turned on when the level of the ramp signal VRAMP is to be increased by a constant slope. For example, all of the plurality of ramp current sources IR0~IRN may be substantially simultaneously or concurrently turned on at an initial operation time. When the level of the ramp signal VRAMP is to be fallen with the constant slope, the ramp current source IR0 may be turned off in response to the control signals SL<0> and SLb<0> at the time toff0, the ramp current source IR1 may be additionally turned off in response to the control signals SL<1> and SLb<1> at the time toff1, the ramp current source IR2 may be additionally turned off in response to the control signals SL<2> and SLb<2> at the time toff2, and the ramp current source IRN may be additionally turned off in response to the control signals SL<N> and SLb<N> at the time toffN. The ramp signal VRAMP may have the lowest voltage level when all the ramp current sources IR0~IRN are turned off.

After that, when the level of the ramp signal VRAMP is to be increased with the constant slope, the ramp current source IR0 may be turned on in response to the control signals SL<0> and SLb<0> at the time ton0, the ramp current source IR1 may be additionally turned on in response to the control signals SL<1> and SLb<1> at the time ton1, the ramp current source IR2 may be additionally turned on in response to the control signals SL<2> and SLb<2> at the time ton2, and the ramp current source IRN may be additionally turned on in response to the control signals SL<N> and SLb<N> at the time tonN. The ramp signal VRAMP may have the same voltage level as in the initial operation time when all the ramp current sources IR0~IRN are turned on.

Although FIG. 4B illustrates an example where all the ramp current sources IR0~IRN are sequentially turned off and sequentially turned on, example embodiments are not limited thereto. For example, only some of the ramp current sources IR0~IRN may be sequentially turned off and sequentially turned on.

Figure 5:
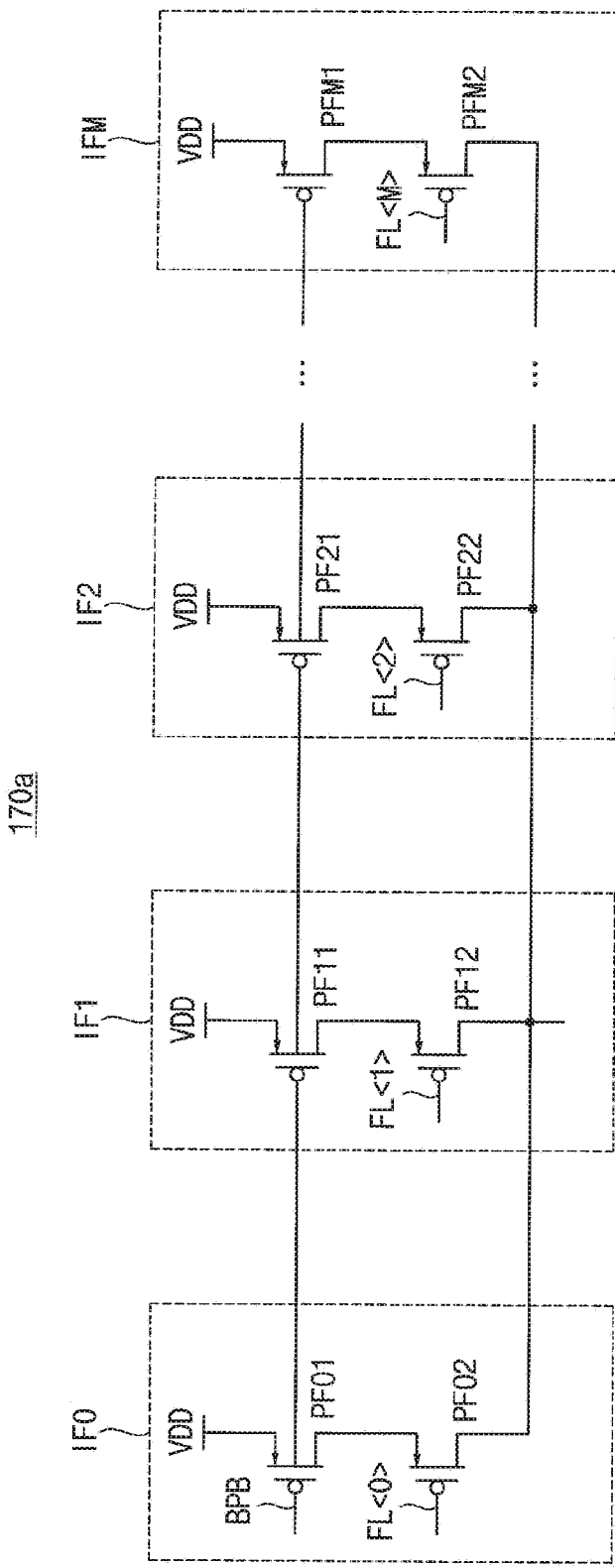
FIG. 5 is a circuit diagram illustrating a configuration of a first offset generator in FIG. 3.

FIG. 5 is a circuit diagram illustrating a configuration of a first offset generator in FIG. 3. Referring to FIGS. 3 and 5, a first offset generator 170a may include a plurality of offset current sources IF0, IF1, IF2, . . . , IFM connected in parallel. The offset current source IF0 may include transistors PF01 and PF02, and may operate in response to control signals BPB and FL<0>. The transistors PF01 and PF02 may be connected in series between the node between the variable ramp current source IRAMP and the ramp resistance RRAMP and the power supply voltage VDD. The control signals BPB and FL<0> may be applied to gate electrodes of the transistors PF01 and PF02, respectively.

The remaining offset current sources IF1~IFM may have substantially the same configuration as the offset current source IF0. For example, the offset current source IF1 may include transistors PF11 and PF12, and may operate in response to control signals BPB and FL<1>. The offset current source IF2 may include transistors PF21 and PF22, and may operate in response to control signals BPB and FL<2>. The offset current source IFM may include transistors PFM1 and PFM2, and may operate in response to control signals BPB and FL<M>.

Unlike the ramp signal generator 160a in which the plurality of ramp current sources IR0~IRN are sequentially turned on and off, the first offset generator 170a may operate in a manner that at least some of the plurality of offset current sources IF0~IFM are substantially simultaneously or concurrently turned on and off. The constant magnitude of decreasing the offset of the ramp signal VRAMP may be determined based on the number of current sources turned off among the plurality of offset current sources IF0~IFM. For example, as the number of current sources simultaneously turned off increases, the constant magnitude may become larger.

Figure 6:
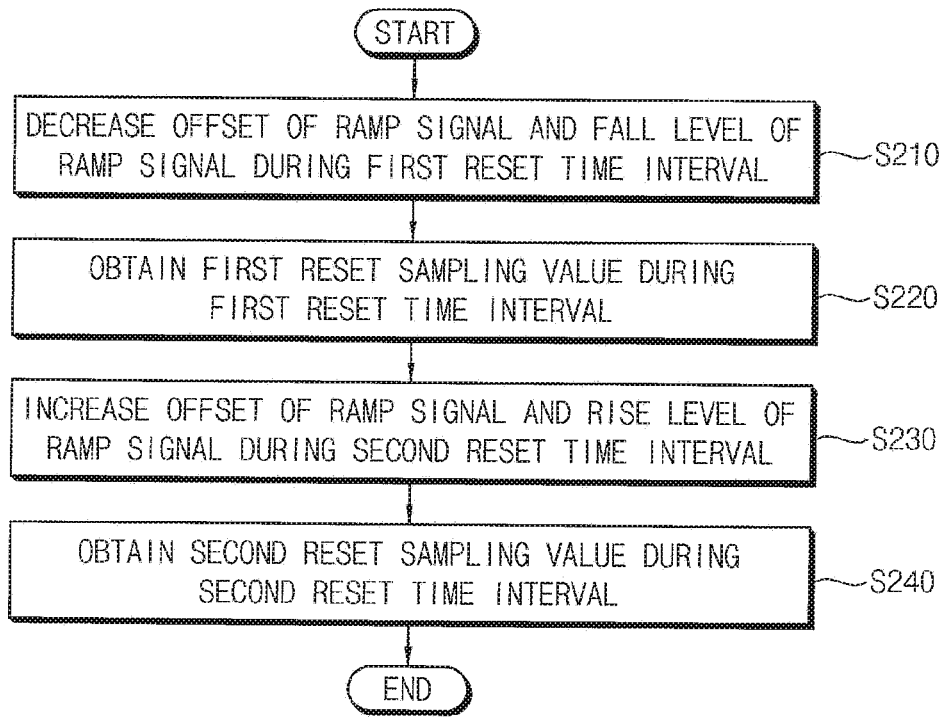
FIG. 6 is a flowchart illustrating an example of sampling a reset component of an analog pixel signal in FIG. 1.
Figure 7:
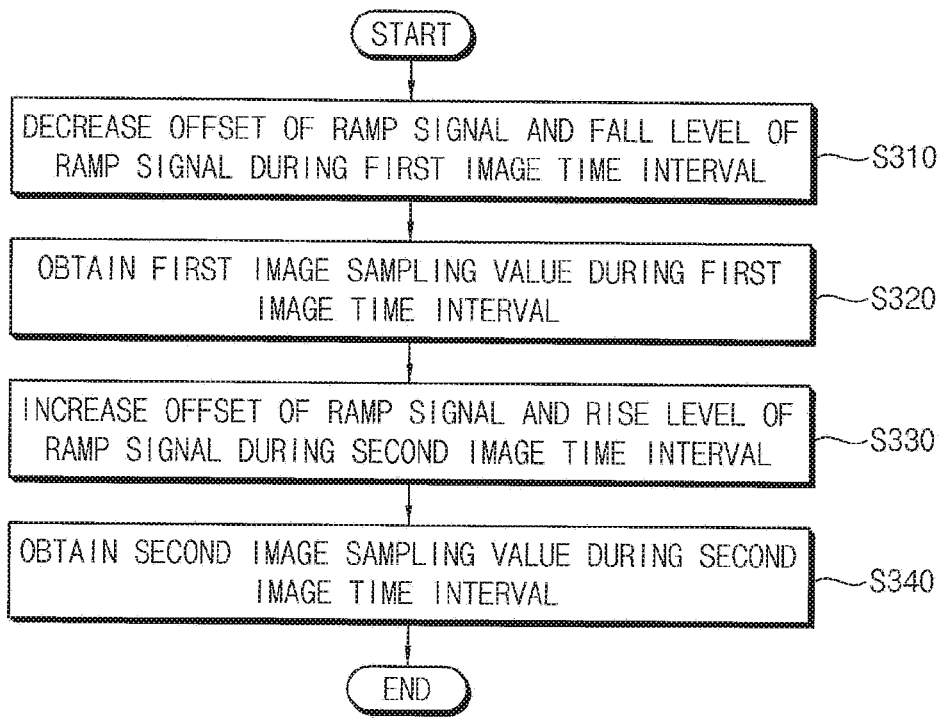
FIG. 7 is a flowchart illustrating an example of sampling an image component of an analog pixel signal in FIG. 1.
Figure 8:
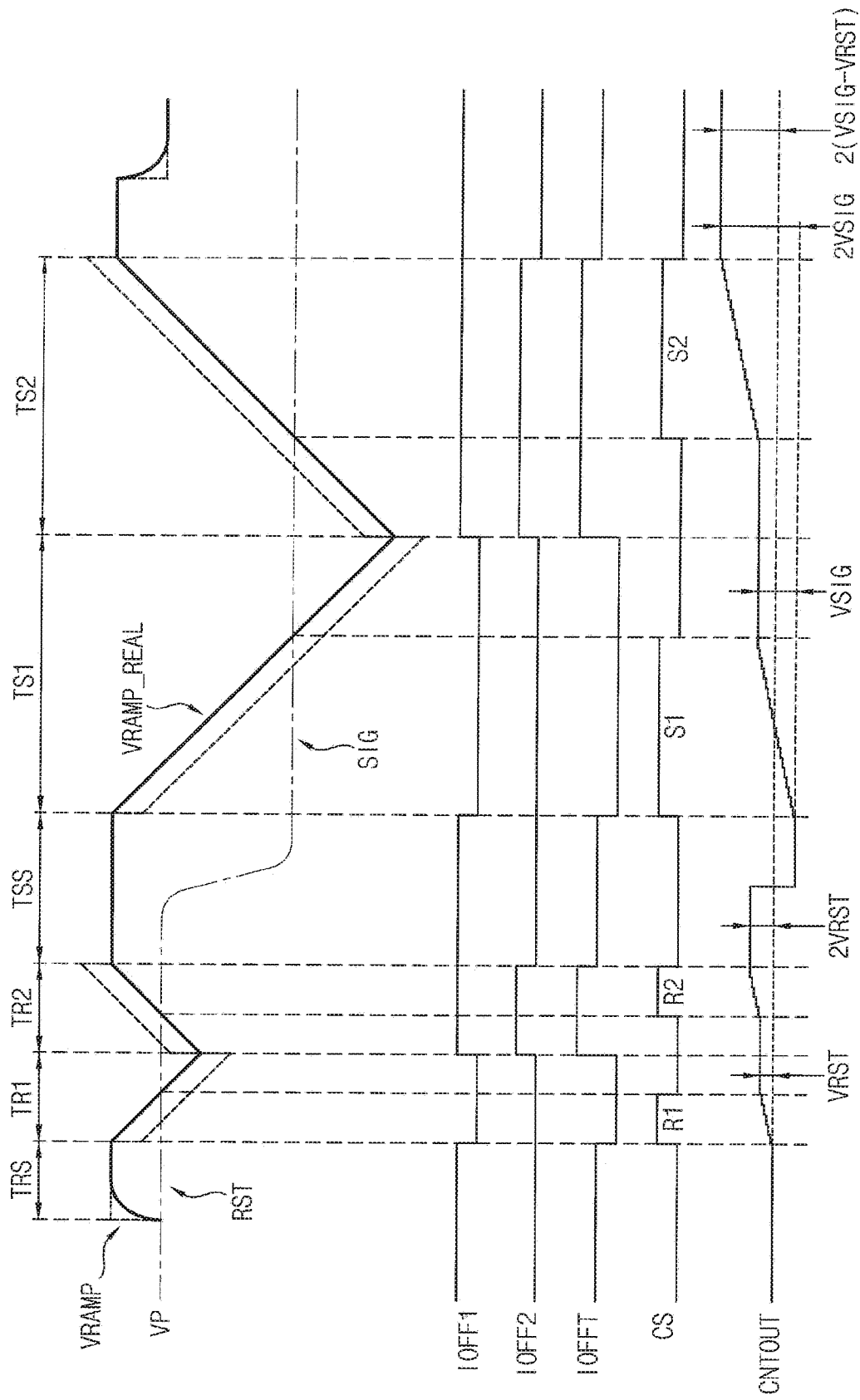

FIG. 6 is a flowchart illustrating an example of sampling a reset component of an analog pixel signal in FIG. 1. FIG. 7 is a flowchart illustrating an example of sampling an image component of an analog pixel signal in FIG. 1. FIGS. 8 and 9 are timing diagrams for describing an operation of sampling the reset component and the image component of the analog pixel signal in FIGS. 6 and 7.

In FIGS. 8 and 9, VP represents a waveform of the analog pixel signal, VRAMP represents an ideal waveform of the ramp signal controlled/generated by the ramp signal generator 160, and VRAMP_REAL represents an actual waveform of the ramp signal actually output from the output terminal. IOFF1 represents turn-on/turn-off of the first offset generator 170, IOFF2 represents turn-on/turn-off of the second offset generator 180, and IOFFT represents the total offset change of the ramp signal according to the turn-on/turn-off of the first and second offset generators 170 and 180. CS represents the comparison signal output from the comparators 142a~142c, and CNTOUT represents an output of the counters 144a~144c, e.g., the digital signal.

Referring to FIGS. 1, 2, 6, 7, 8 and 9, an example where a reset component RST of the analog pixel signal VP is sampled twice and an image component SIG of the analog pixel signal VP is sampled the same number of times as the reset component VP, that is, twice will be described. When sampling the reset component RST of the analog pixel signal VP (step S200), the ramp signal VRAMP may be maintained at a constant level during an initial reset time interval TRS. For example, as described with reference to FIGS. 4A and 4B, all of the plurality of ramp current sources IR0~IRN may be simultaneously turned on. At this time, the first offset generator 170 may be turned on as IOFF1 is shown at a high level, the second offset generator 180 may be turned off as IOFF2 is shown at a low level, and thus the ramp signal VRAMP may have an initial offset (e.g., zero) as IOFFT is shown at an intermediate level. The actual waveform VRAMP_REAL of the ramp signal may take a certain time to reach the constant level.

During a first reset time interval TR1 subsequent to the initial reset time interval TRS, the offset of the ramp signal VRAMP may decrease by a constant magnitude a with respect to the initial offset while falling the level of the ramp signal VRAMP with a constant slope 8 (step S210). For example, as described with reference to FIGS. 4A and 4B, the plurality of ramp current sources IR0~IRN may be sequentially turned off for falling the level of the ramp signal VRAMP. Particularly, only some of the ramp current sources IR0~IRN may be sequentially turned off because the amount of falling of the ramp signal VRAMP is relatively small. In addition, the first offset generator 170 may be turned off as IOFF1 is shown at a low level for decreasing the offset of the ramp signal VRAMP, and thus the ramp signal VRAMP may have a reduced offset relative to the initial offset as IOFFT is shown at a low level. As the offset of the ramp signal VRAMP decreases at the same time as the start of the first reset time interval TR1, the actual waveform VRAMP_REAL of the ramp signal may have a linear waveform during the entire first reset time interval TR1.

During the first reset time interval TR1, a first reset sampling value representing the reset component RST may be obtained based on a first reset time point at which the ramp signal (e.g., the actual waveform VRAMP_REAL of the ramp signal) crosses or meets the analog pixel signal VP (step S220). For example, the comparison signal CS may have a high level from a start point of the first reset time interval TR1 to the first reset time point, and a length of a time interval R1 in which the comparison signal CS has the high level within the first reset time interval TR1 may represent the first reset sampling value.

During a second reset time interval TR2 subsequent to the first reset time interval TR1, the offset of the ramp signal VRAMP may increase by the constant magnitude a with respect to the initial offset while increasing the level of the ramp signal VRAMP with the constant slope 8 (step S230). For example, as described with reference to FIGS. 4A and 4B, the ramp current sources turned off among the plurality of ramp current sources IR0~IRN may be sequentially turned on to thereby increase the level of the ramp signal VRAMP. In addition, the first offset generator 170 may be turned on as IOFF1 is shown at a high level and the second offset generator 180 may be turned on as IOFF2 is shown at a high level for increasing the offset of the ramp signal VRAMP, and thus the ramp signal VRAMP may have an increased offset relative to the initial offset as IOFFT is shown at a high level. As the offset of the ramp signal VRAMP increases at the same time as the start of the second reset time interval TR2, the actual waveform VRAMP_REAL of the ramp signal may have a linear waveform during the entire second reset time interval TR2.

In some example embodiments, since the first and second offset generators 170 and 180 are all turned off in the first reset time interval TR1 and all turned on in the second reset time interval TR2, a difference between the level (e.g., a voltage level) of the ramp signal VRAMP at an end point of the first reset time interval TR1 and the level of the ramp signal VRAMP at a start point of the second reset time interval TR2 may be substantially equal to twice the constant magnitude a. In other example embodiments, although not illustrated, the offset variations due to the first and second offset generators 170 and 180 may be different from each other, and thus the difference between the level of the ramp signal VRAMP at the end point of the first reset time interval TR1 and the level of the ramp signal VRAMP at the start point of the second reset time interval TR2 may not be equal to twice the constant magnitude a.

During the second reset time interval TR2, a second reset sampling value representing the reset component RST may be obtained based on a second reset time point at which the ramp signal (e.g., the actual waveform VRAMP_REAL of the ramp signal) crosses the analog pixel signal VP (step S240). For example, the comparison signal CS may have a high level from the second reset time point to an end point of the second reset time interval TR2, and a length of a time interval R2 in which the comparison signal CS has the high level within the second reset time interval TR2 may represent the second reset sampling value.

When sampling the image component SIG of the analog pixel signal VP (step S300) after sampling the reset component RST, the ramp signal VRAMP may be maintained at the constant level during an initial image time interval TSS. An operation in the initial image time interval TSS may be substantially the same as an operation in the initial reset time interval TRS, except that the actual waveform VRAMP_REAL of the ramp signal reaches the constant level immediately without a certain time. In addition, the analog pixel signal VP may be changed from the reset component RST to the image component SIG in the initial image time interval TSS.

During a first image time interval TS1 subsequent to the initial image time interval TSS, the offset of the ramp signal VRAMP may decrease by the constant magnitude a with respect to the initial offset while falling the level of the ramp signal VRAMP with the constant slope 8 (step S310). An operation in the first image time interval TS1 may be substantially the same as an operation in the first reset time interval TR1, except that all of the plurality of ramp current sources IR0~IRN are sequentially turned off because the amount of falling of the ramp signal VRAMP is relatively large.

During the first image time interval TS1, a first image sampling value representing the image component SIG may be obtained based on a first image time point at which the ramp signal (e.g., the actual waveform VRAMP_REAL of the ramp signal) crosses or meets the analog pixel signal VP (step S320). For example, the comparison signal CS may have a high level from a start point of the first image time interval TS1 to the first image time point, and a length of a time interval S1 in which the comparison signal CS has the high level within the first image time interval TS1 may represent the first image sampling value.

During a second image time interval TS2 subsequent to the first image time interval TS1, the offset of the ramp signal VRAMP may increase by the constant magnitude a with respect to the initial offset while increasing the level of the ramp signal VRAMP with the constant slope 8 (step S330). An operation in the second image time interval TS2 may be substantially the same as an operation in the second reset time interval TR2, except that all of the plurality of ramp current sources IR0~IRN are sequentially turned on.

During the second image time interval TS2, a second image sampling value representing the image component SIG may be obtained based on a second image time point at which the ramp signal (e.g., the actual waveform VRAMP_REAL of the ramp signal) crosses the analog pixel signal VP (step S340). For example, the comparison signal CS may have a high level from the second image time point to an end point of the second image time interval TS2, and a length of a time interval S2 in which the comparison signal CS has the high level within the second image time interval TS2 may represent the second image sampling value.

When generating the digital signal corresponding to the effective image component based on the sampled reset component and the sampled image component (step S400), a value of VRST representing the first reset sampling value may be obtained by increasing a count value during the time interval R1 in which the comparison signal CS has the high level within the first reset time interval TR1, and a value of 2VRST representing the sum of the first and second reset sampling values may be obtained by increasing the count value during the time interval R2 in which the comparison signal CS has the high level within the second reset time interval TR2. In addition, the count value may be reversed with respect to an initial count value in the initial image time interval TSS, a value of VSIG representing the first image sampling value may be obtained by increasing the count value during the time interval S1 in which the comparison signal CS has the high level within the first image time interval TS1, and a value of 2VSIG representing the sum of the first and second image sampling values may be obtained by increasing the count value during the time interval S2 in which the comparison signal CS has the high level within the second image time interval TS2. Finally, a value of 2(VSIG−VRST) may be obtained, and a value of (VSIG−VRST) which is the effective image component may be obtained as the digital signal by dividing the value of 2(VSIG−VRST) by two.

Figure 10A:
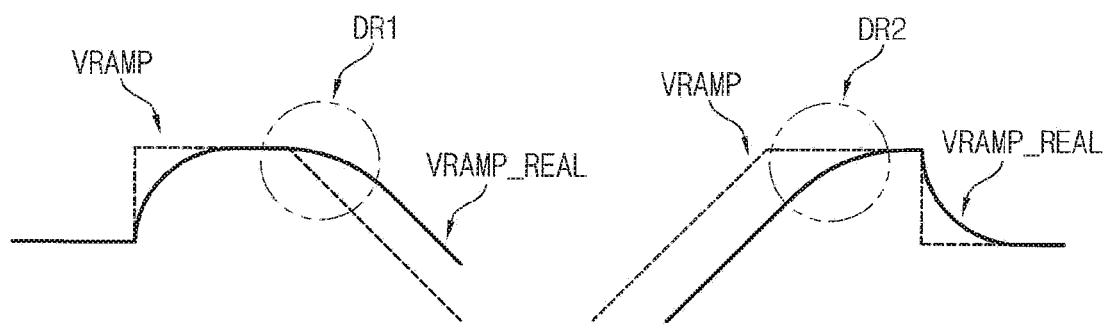
FIGS. 10A and 10B are diagrams for describing an effect of a method of operating an image sensor according to example embodiments.
Figure 10B:
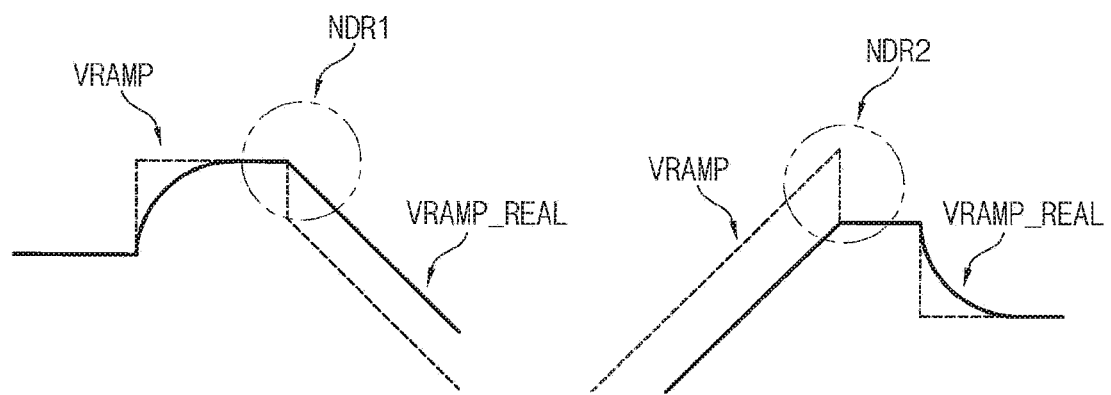

FIGS. 10A and 10B are diagrams for describing an effect of a method of operating an image sensor according to example embodiments. Referring to FIG. 10A, when the level of the ramp signal VRAMP is decreased/increased with the constant slope without decreasing/increasing the offset of the ramp signal VRAMP, the settling time may be required until a linear waveform is output in the actual waveform VRAMP_REAL of the ramp signal. This settling time may be caused by RC component of the output stage by the resistor R and the capacitor C illustrated in FIG. 3, and the settling time may increase as the RC component of the output stage becomes larger due to a decrease in output power of the ramp signal generator 160, an increase in resolution, or the like. Distortion regions DR1 and DR2 may occur in the actual waveform VRAMP_REAL of the ramp signal by such settling time.

Referring to FIG. 10B, when the offset of the ramp signal VRAMP decreases by the constant magnitude while falling the level of the ramp signal VRAMP with the constant slope or when the offset of the ramp signal VRAMP increases by the constant magnitude while increasing the level of the ramp signal VRAMP with the constant slope, the settling time described above may be reduced, regions NDR1 and NDR2 in the actual waveform VRAMP_REAL of the ramp signal corresponding to the distortion regions DR1 and DR2 in FIG. 10A may not have any distortion, and a linear interval in the actual waveform VRAMP_REAL of the ramp signal VRAMP may increase. As described with reference to FIG. 5, the decrement/increment of the offset of the ramp signal VRAMP may be determined based on the number of current sources turned off/on among the plurality of offset current sources IF0~IFM, and the linear interval in the actual waveform VRAMP_REAL of the ramp signal VRAMP may be increased as much as possible by adjusting the variation of the offset of the ramp signal VRAMP.

In addition, as described with reference to FIGS. 8 and 9, the ideal waveform of the ramp signal VRAMP controlled/generated by the ramp signal generator 160 may have discontinuous values at a boundary of two time intervals (e.g., the first and second reset time intervals TR1 and TR2) where the decrease/increase of the offset occurs, however, the actual waveform VRAMP_REAL of the ramp signal actually output from the output terminal may have a continuous value at the boundary of two time intervals where the decrease/increase of the offset occurs.

Figure 11:
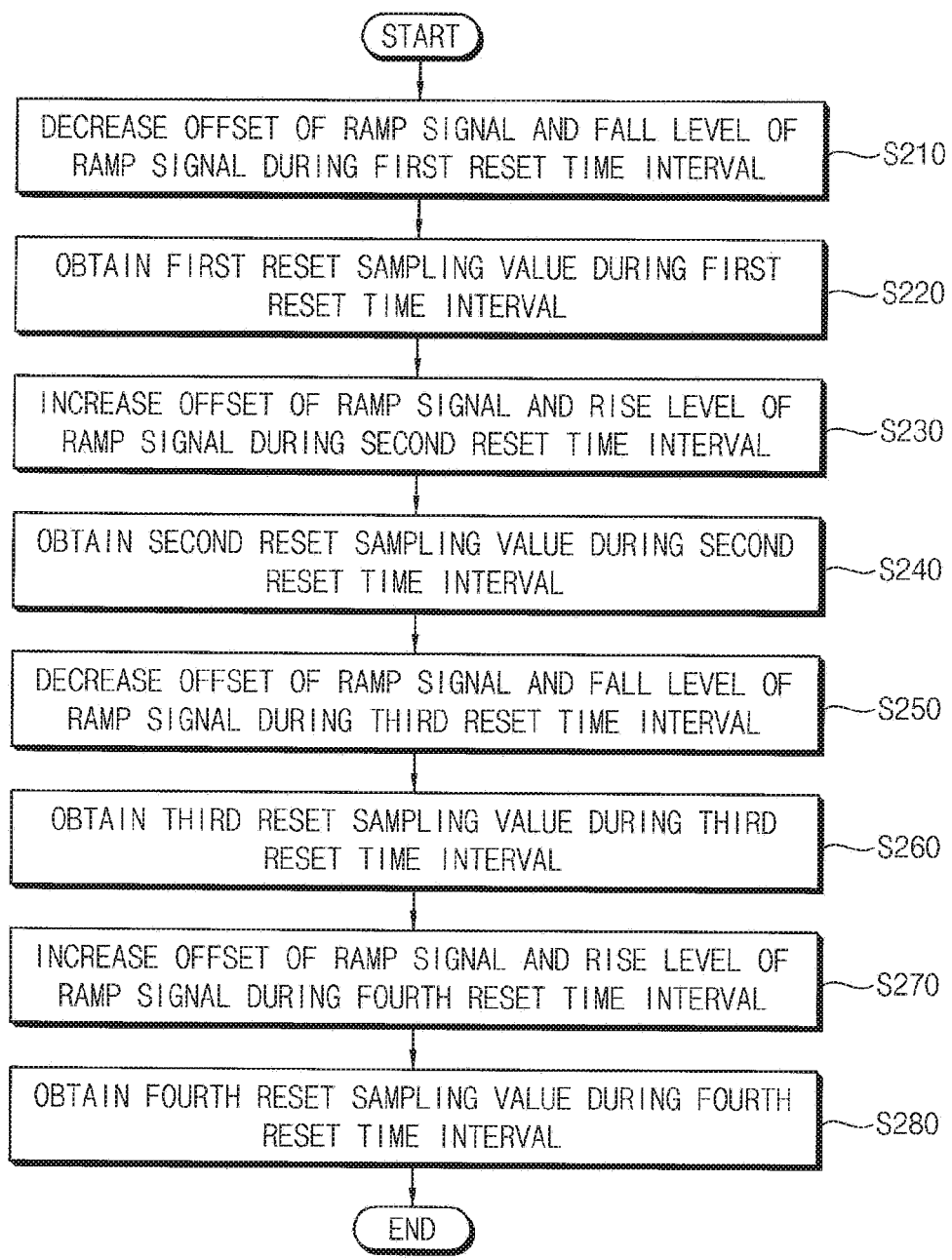
FIG. 11 is a flowchart illustrating another example of sampling a reset component of an analog pixel signal in FIG. 1.
Figure 12:
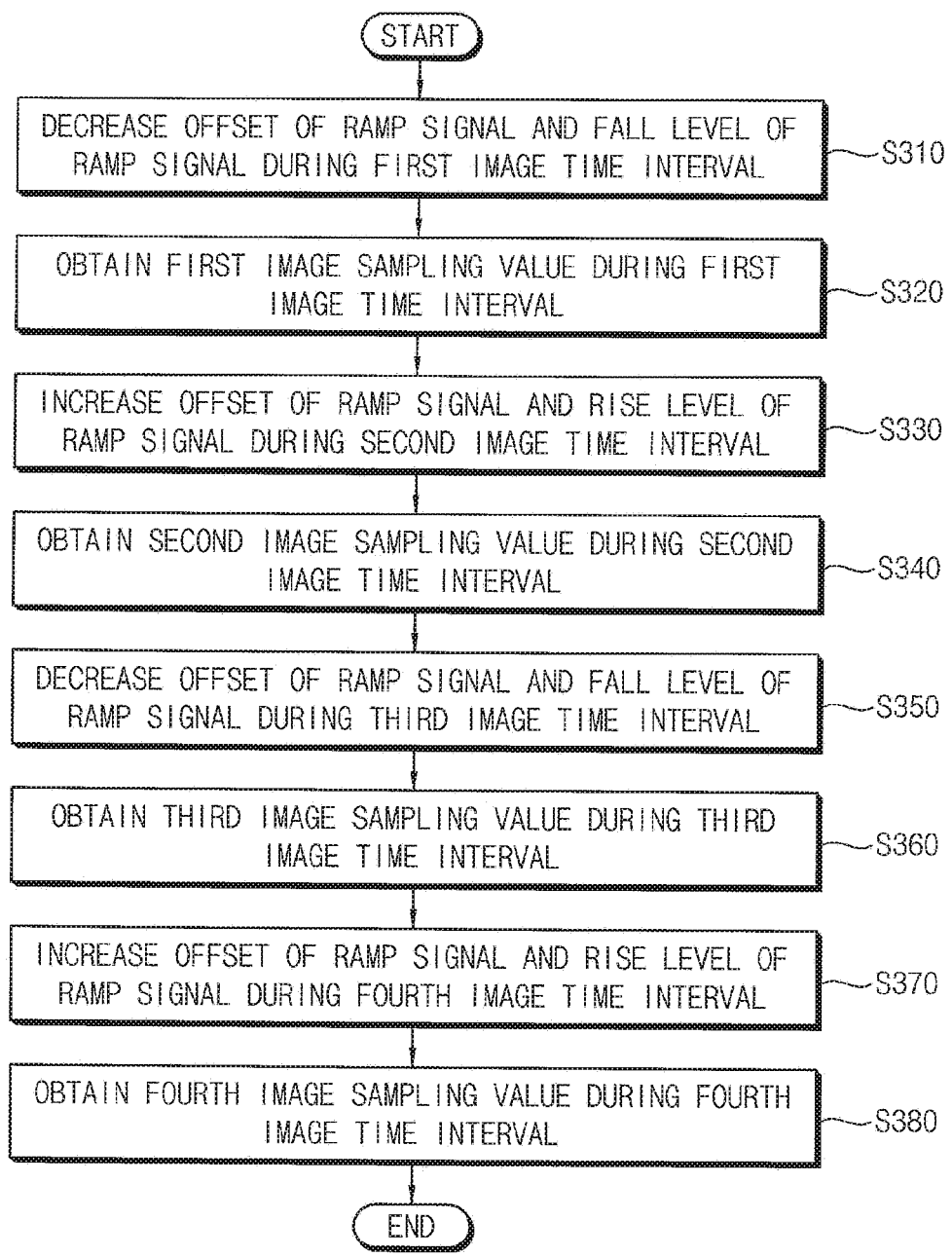
FIG. 12 is a flowchart illustrating another example of sampling an image component of an analog pixel signal in FIG. 1.
Figure 13:
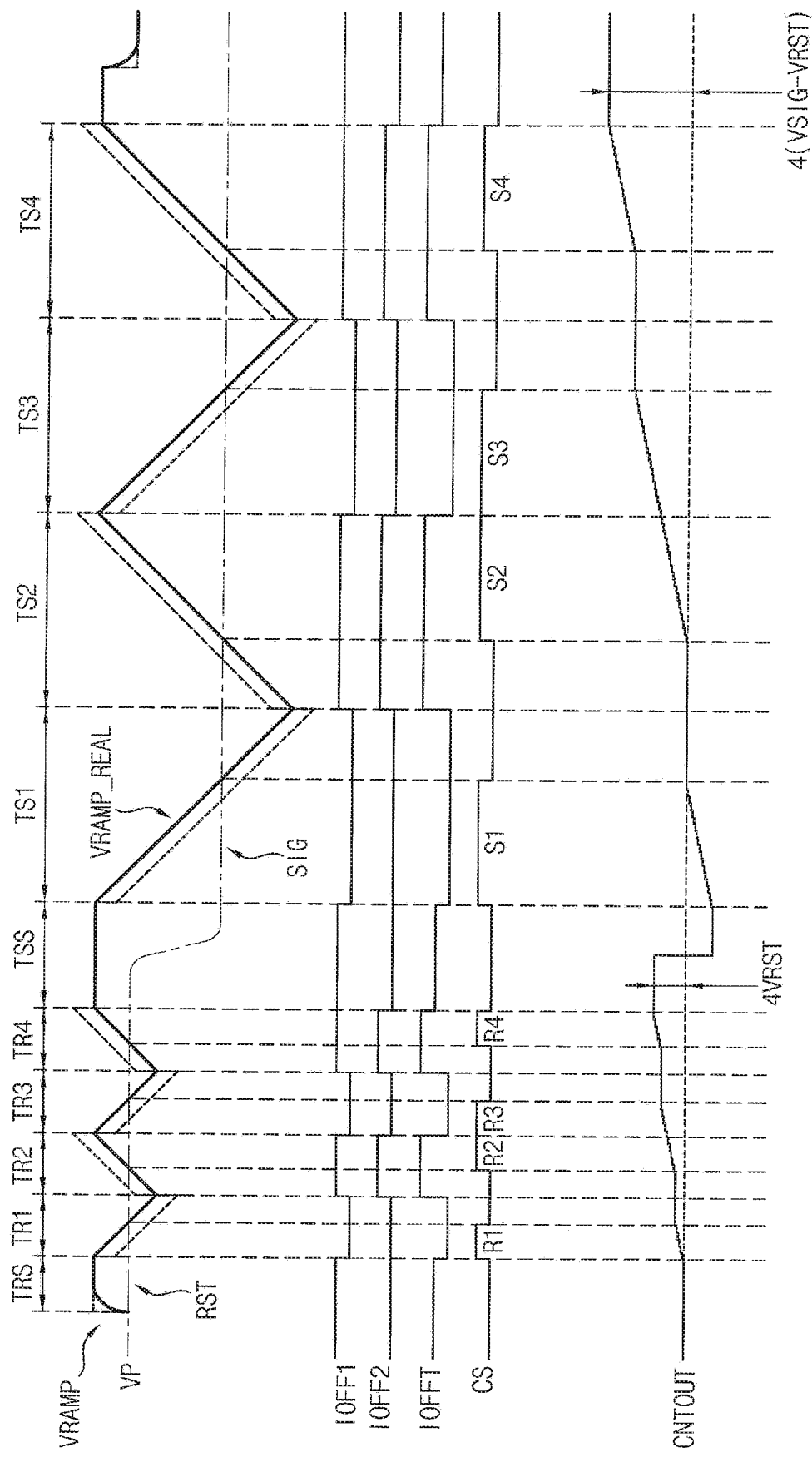
FIG. 13 is a timing diagram for describing an operation of sampling the reset component and the image component of the analog pixel signal in FIGS. 11 and 12.

FIG. 11 is a flowchart illustrating another example of sampling a reset component of an analog pixel signal in FIG. 1. FIG. 12 is a flowchart illustrating another example of sampling an image component of an analog pixel signal in FIG. 1. FIG. 13 is a timing diagram for describing an operation of sampling the reset component and the image component of the analog pixel signal in FIGS. 11 and 12. The descriptions repeated with FIGS. 6, 7, 8 and 9 will be omitted.

Referring to FIGS. 1, 2, 11, 12 and 13, an example where the reset component RST of the analog pixel signal VP is sampled four times and the image component SIG of the analog pixel signal VP is sampled the same number of times as the reset component VP, that is, four times will be described.

When sampling the reset component RST of the analog pixel signal VP (step S200), operations in the initial reset time interval TRS, the first reset time interval TR1 and the second reset time interval TR2 and steps S210, S220, S230 and S240 may be substantially the same as those described with reference to FIGS. 6, 7, 8 and 9.

During a third reset time interval TR3 subsequent to the second reset time interval TR2, the offset of the ramp signal VRAMP may decrease by the constant magnitude a with respect to the initial offset while falling the level of the ramp signal VRAMP with the constant slope 8 (step S250), and a third reset sampling value representing the reset component RST may be obtained based on a third reset time point at which the actual waveform VRAMP_REAL of the ramp signal crosses the analog pixel signal VP (step S260). Operations in the third reset time interval TR3 and steps S250 and S260 may be substantially the same as the operations in the first reset time interval TR1 and steps S210 and S220, respectively. A length of a time interval R3 in which the comparison signal CS has the high level within the third reset time interval TR3 may represent the third reset sampling value.

During a fourth reset time interval TR4 subsequent to the third reset time interval TR3, the offset of the ramp signal VRAMP may increase by the constant magnitude a with respect to the initial offset while increasing the level of the ramp signal VRAMP with the constant slope 8 (step S270), and a fourth reset sampling value representing the reset component RST may be obtained based on a fourth reset time point at which the actual waveform VRAMP_REAL of the ramp signal crosses the analog pixel signal VP (step S280). Operations in the fourth reset time interval TR4 and steps S270 and S280 may be substantially the same as the operations in the second reset time interval TR2 and steps S230 and S240, respectively. A length of a time interval R4 in which the comparison signal CS has the high level within the fourth reset time interval TR4 may represent the fourth reset sampling value.

When sampling the image component SIG of the analog pixel signal VP (step S300), operations in the initial image time interval TSS, the first image time interval TS1 and the second image time interval TS2 and steps S310, S320, S330 and S340 may be substantially the same as those described with reference to FIGS. 6, 7, 8 and 9.

During a third image time interval TS3 subsequent to the second image time interval TS2, the offset of the ramp signal VRAMP may decrease by the constant magnitude a with respect to the initial offset while falling the level of the ramp signal VRAMP with the constant slope 8 (step S350), and a third image sampling value representing the image component SIG may be obtained based on a third image time point at which the actual waveform VRAMP_REAL of the ramp signal crosses the analog pixel signal VP (step S360). Operations in the third image time interval TS3 and steps S350 and S360 may be substantially the same as the operations in the first image time interval TS1 and steps S310 and S320, respectively. A length of a time interval S3 in which the comparison signal CS has the high level within the third image time interval TS3 may represent the third image sampling value.

During a fourth image time interval TS4 subsequent to the third image time interval TS3, the offset of the ramp signal VRAMP may increase by the constant magnitude a with respect to the initial offset while increasing the level of the ramp signal VRAMP with the constant slope 8 (step S370), and a fourth image sampling value representing the image component SIG may be obtained based on a fourth image time point at which the actual waveform VRAMP_REAL of the ramp signal crosses the analog pixel signal VP (step S380). Operations in the fourth image time interval TS4 and steps S370 and S380 may be substantially the same as the operations in the second image time interval TS2 and steps S330 and S340, respectively. A length of a time interval S4 in which the comparison signal CS has the high level within the fourth image time interval TS4 may represent the fourth image sampling value.

When generating the digital signal (step S400), a value of 4VRST representing the sum of the first, second third and fourth reset sampling values may be obtained by sequentially increasing the count value during the time intervals R1, R2, R3 and R4 in which the comparison signal CS has the high level within the first, second third and fourth reset time intervals TR1, TR2, TR3 and TR4, the count value may be reversed with respect to the initial count value in the initial image time interval TSS, and a value of 4VSIG representing the sum of the first, second third and fourth image sampling values may be obtained by sequentially increasing the count value during the time intervals S1, S2, S3 and S4 in which the comparison signal CS has the high level within the first, second third and fourth image time intervals TS1, TS2, TS3 and TS4. Finally, a value of 4(VSIG−VRST) may be obtained, and the value of (VSIG−VRST) which is the effective image component may be obtained as the digital signal by dividing the value of 4(VSIG−VRST) by four.

Figure 14:
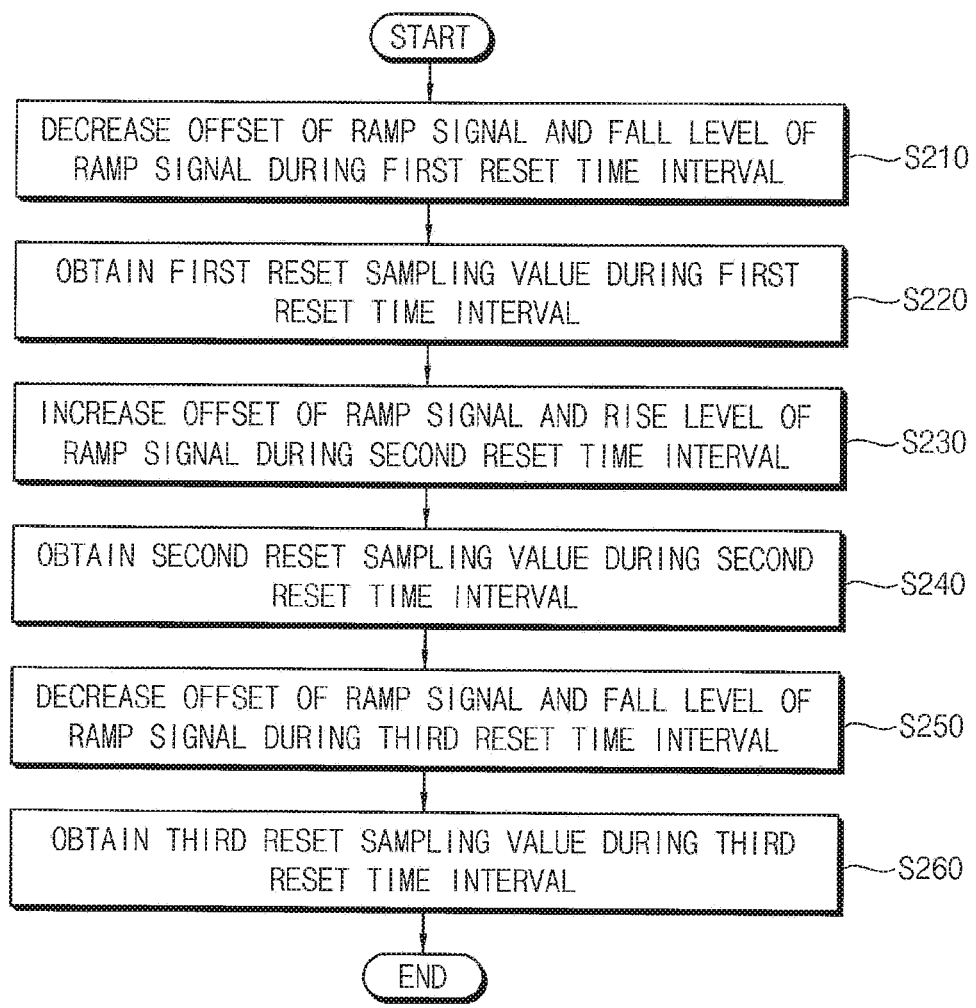
FIG. 14 is a flowchart illustrating still another example of sampling a reset component of an analog pixel signal in FIG. 1.
Figure 15:
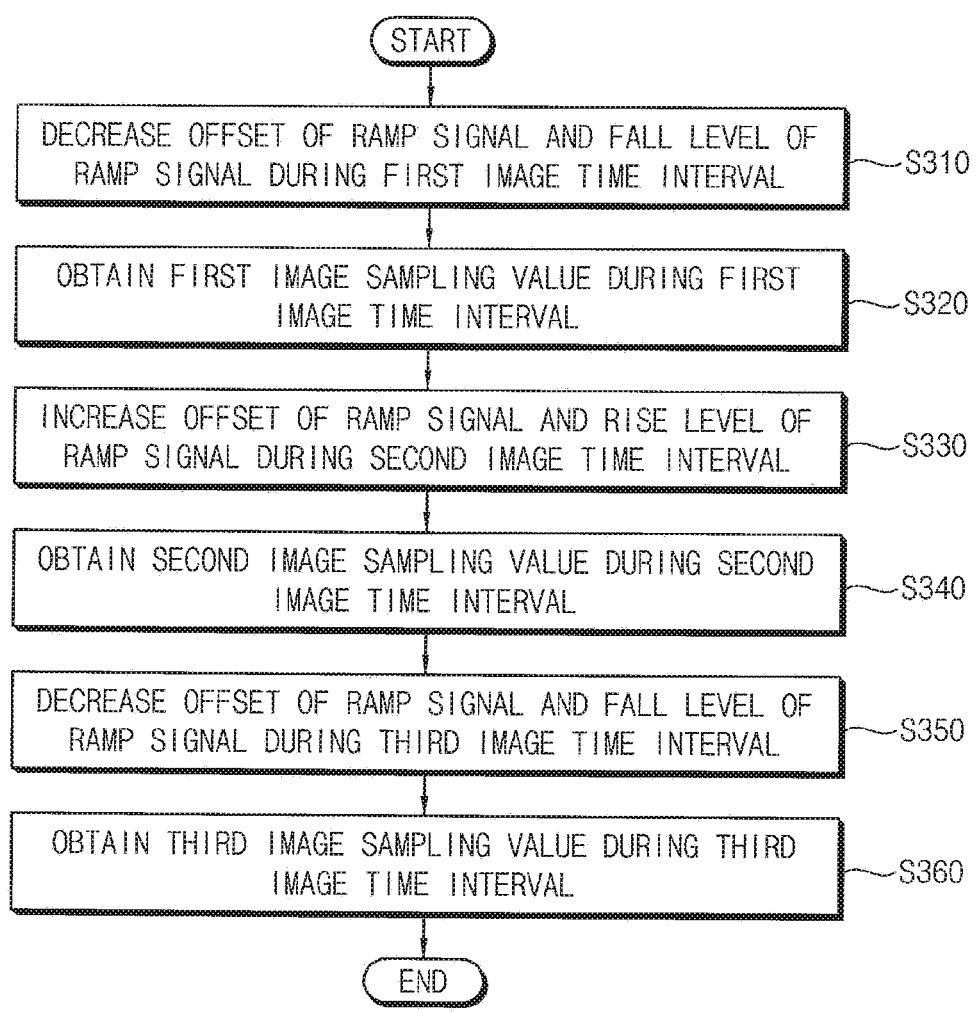
FIG. 15 is a flowchart illustrating still another example of sampling an image component of an analog pixel signal in FIG. 1.
Figure 16:
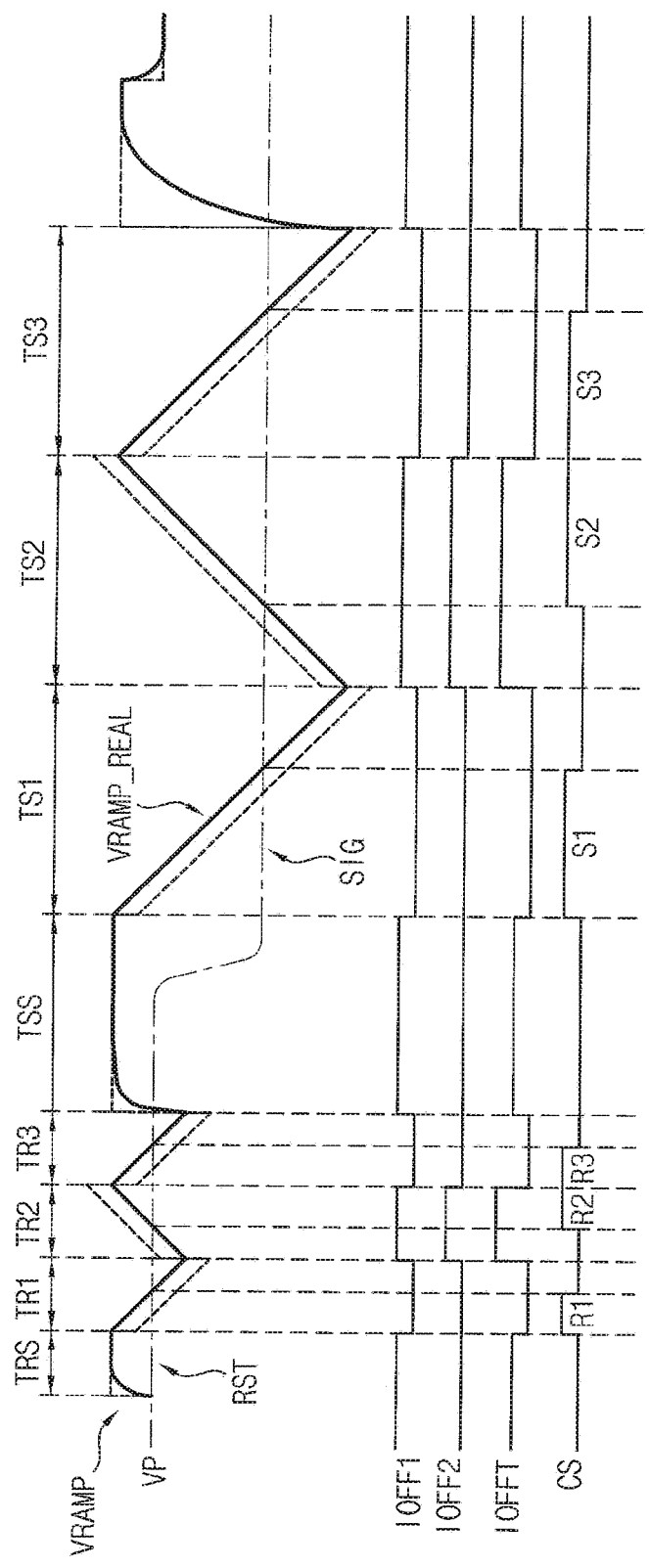
FIG. 16 is a timing diagram for describing an operation of sampling the reset component and the image component of the analog pixel signal in FIGS. 14 and 15.

FIG. 14 is a flowchart illustrating still another example of sampling a reset component of an analog pixel signal in FIG. 1. FIG. 15 is a flowchart illustrating still another example of sampling an image component of an analog pixel signal in FIG. 1. FIG. 16 is a timing diagram for describing an operation of sampling the reset component and the image component of the analog pixel signal in FIGS. 14 and 15. The descriptions repeated with FIGS. 6, 7, 8, 9, 11, 12 and 13 will be omitted.

Referring to FIGS. 1, 2, 14, 15 and 16, an example where the reset component RST of the analog pixel signal VP is sampled three times and the image component SIG of the analog pixel signal VP is sampled the same number of times as the reset component VP, that is, three times will be described. In other words, example embodiments may also be applied to a case of sampling the reset component RST and the image component SIG odd number times.

When sampling the reset component RST of the analog pixel signal VP (step S200), operations in the initial reset time interval TRS, the first reset time interval TR1 and the second reset time interval TR2 and steps S210, S220, S230 and S240 may be substantially the same as those described with reference to FIGS. 6, 7, 8 and 9, and operations in the third reset time interval TR3 and steps S250 and S260 may be substantially the same as those described with reference to FIGS. 11, 12 and 13.

When sampling the image component SIG of the analog pixel signal VP (step S300), operations in the initial image time interval TSS, the first image time interval TS1 and the second image time interval TS2 and steps S310, S320, S330 and S340 may be substantially the same as those described with reference to FIGS. 6, 7, 8 and 9, and operations in the third image time interval TS3 and steps S350 and S360 may be substantially the same as those described with reference to FIGS. 11, 12 and 13.

Although not illustrated in detail, when generating the digital signal (step S400), a value of 3VRST may be obtained by sequentially increasing the count value during the time intervals R1, R2 and R3 within the reset time intervals TR1, TR2 and TR3, and a value of 3VSIG may be obtained by sequentially increasing the count value during the time intervals S1, S2 and S3 within the image time intervals TS1, TS2 and TS3. Finally, a value of 3(VSIG−VRST) may be obtained, and the value of (VSIG−VRST) which is the effective image component may be obtained as the digital signal by dividing the value of 3(VSIG−VRST) by three.

Figure 17:
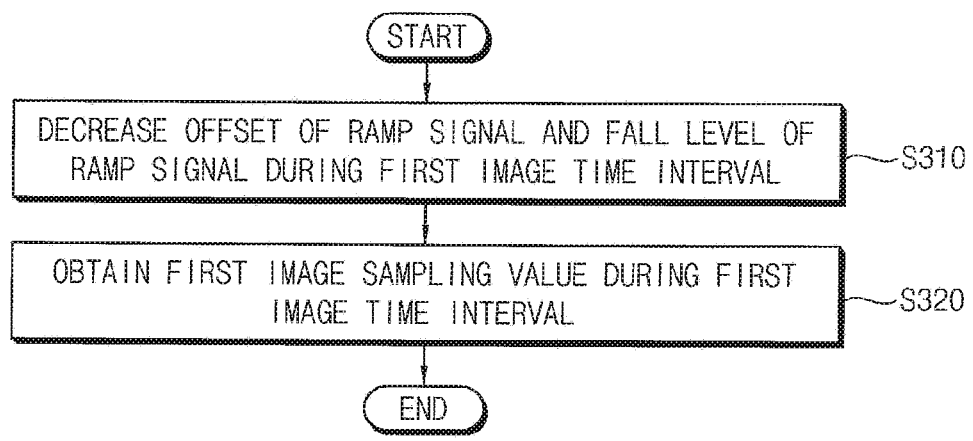
FIG. 17 is a flowchart illustrating still another example of sampling an image component of an analog pixel signal in FIG. 1.
Figure 18:
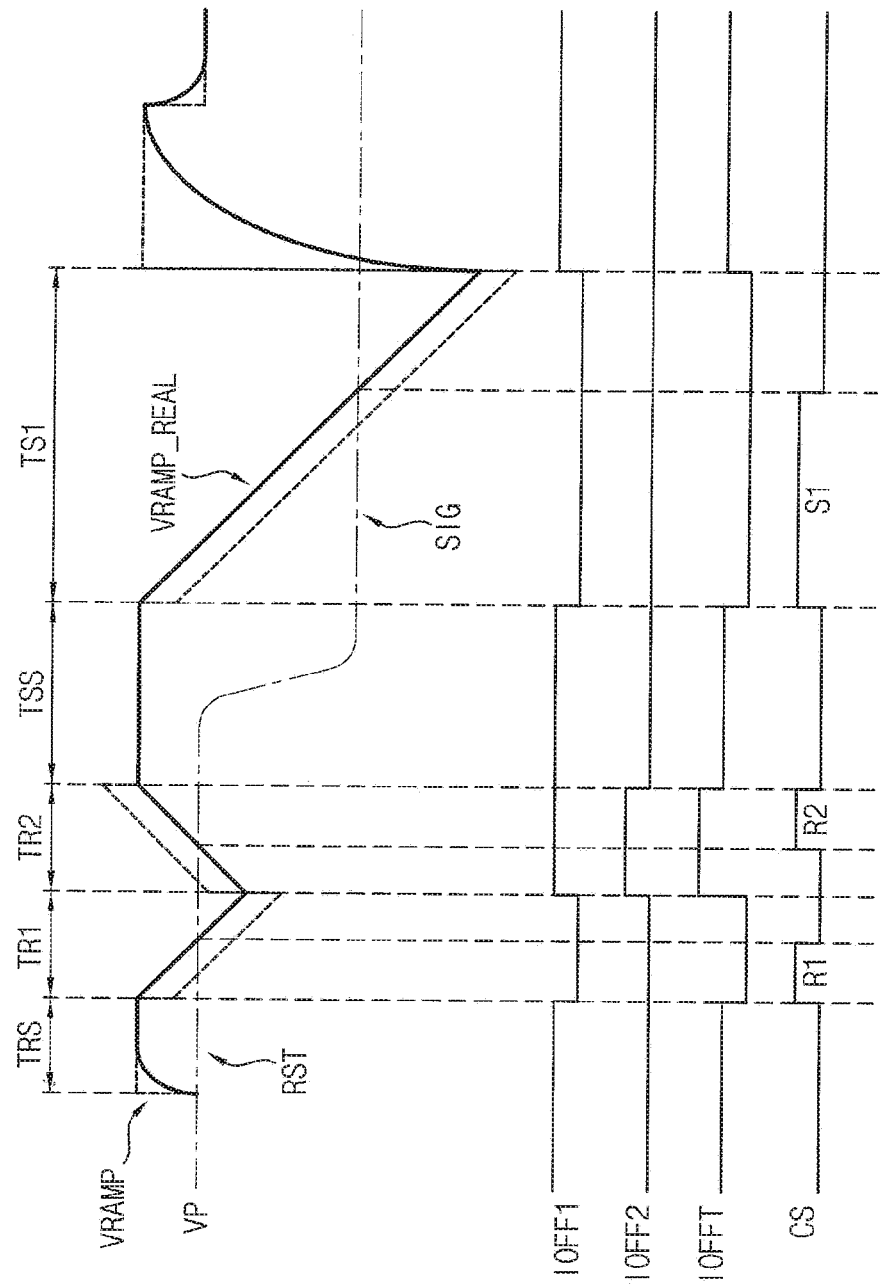
FIG. 18 is a timing diagram for describing an operation of sampling the reset component and the image component of the analog pixel signal in FIGS. 6 and 17.

FIG. 17 is a flowchart illustrating still another example of sampling an image component of an analog pixel signal in FIG. 1. FIG. 18 is a timing diagram for describing an operation of sampling the reset component and the image component of the analog pixel signal in FIGS. 6 and 17. The descriptions repeated with FIGS. 6, 7, 8 and 9 will be omitted.

Referring to FIGS. 1, 2, 6, 17 and 18, an example where the reset component RST of the analog pixel signal VP is sampled twice and the image component SIG of the analog pixel signal VP is sampled once will be described. In other words, example embodiments may also be applied to a case where the number of times of sampling the image component SIG is less than the number of times of sampling the reset component RST.

When sampling the reset component RST of the analog pixel signal VP (step S200), operations in the initial reset time interval TRS, the first reset time interval TR1 and the second reset time interval TR2 and steps S210, S220, S230 and S240 may be substantially the same as those described with reference to FIGS. 6, 7, 8 and 9.

When sampling the image component SIG of the analog pixel signal VP (step S300), operations in the initial image time interval TSS and the first image time interval TS1 and steps S310 and S320 may be substantially the same as those described with reference to FIGS. 6, 7, 8 and 9.

Although not illustrated in detail, when generating the digital signal (step S400), a value of 2VRST may be obtained by sequentially increasing the count value during the time intervals R1 and R2 within the reset time intervals TR1 and TR2, a value of VRST may be obtained by dividing the value of 2VRST by two, a value of VSIG may be obtained by increasing the count value during the time interval S1 within the image time interval TS1, and the value of (VRST−VSIG) which is the effective image component may be finally obtained as the digital signal. Alternatively, the value of 2VRST may be obtained by sequentially increasing the count value during the time intervals R1 and R2 within the reset time intervals TR1 and TR2, a value of 2VSIG may be obtained by increasing the count value by double during the time interval S1 within the image time interval TS1, a value of 2(VRST−VSIG) may be obtained, and the value of (VRST−VSIG) which is the effective image component may be finally obtained as the digital signal by dividing the value of 2(VRST−VSIG) by two.

Figure 19:
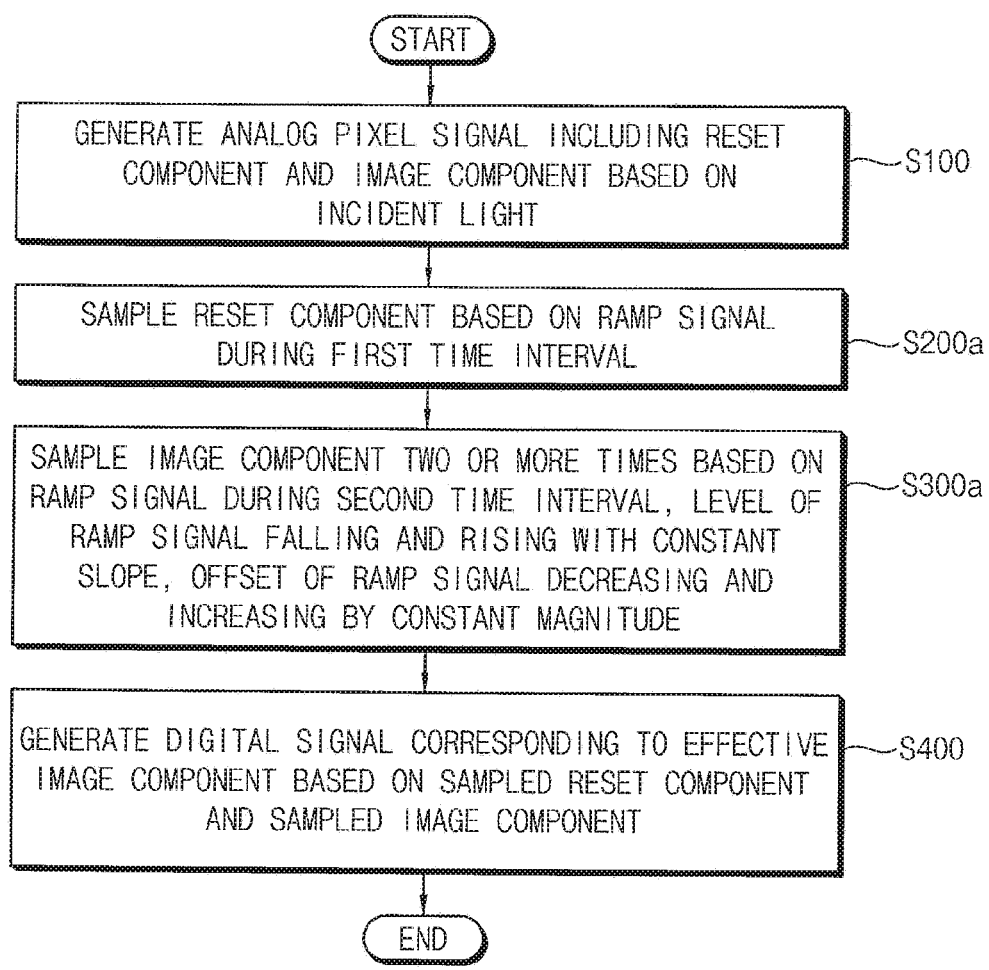
FIG. 19 is a flowchart illustrating a method of operating an image sensor according to example embodiments.

FIG. 19 is a flowchart illustrating a method of operating an image sensor according to example embodiments. The descriptions repeated with FIG. 1 will be omitted. Referring to FIG. 19, in a method of operating an image sensor according to example embodiments, steps S100 and S400 may be substantially the same as steps S100 and S400 in FIG. 1, respectively. The reset component of the analog pixel signal is sampled based on a ramp signal during a first time interval (step S200a), and the image component of the analog pixel signal is sampled two or more times based on the ramp signal during a second time interval subsequent to the first time interval (step S300a). A level of the ramp signal decreases and increases with a constant slope during the second time interval, an offset of the ramp signal decreases and increases by a constant magnitude during the second time interval. In other words, the sampling operation for the image component may be a multiple sampling operation in which one analog pixel signal is sampled multiple times, and the number of times of sampling the image component may be greater than the number of times of sampling the reset component.

Figure 20:
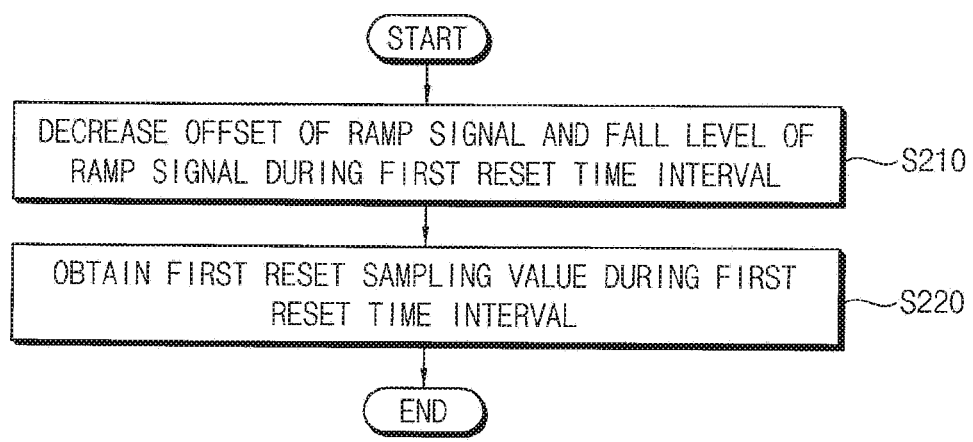
FIG. 20 is a flowchart illustrating an example of sampling a reset component of an analog pixel signal in FIG. 19.
Figure 21:
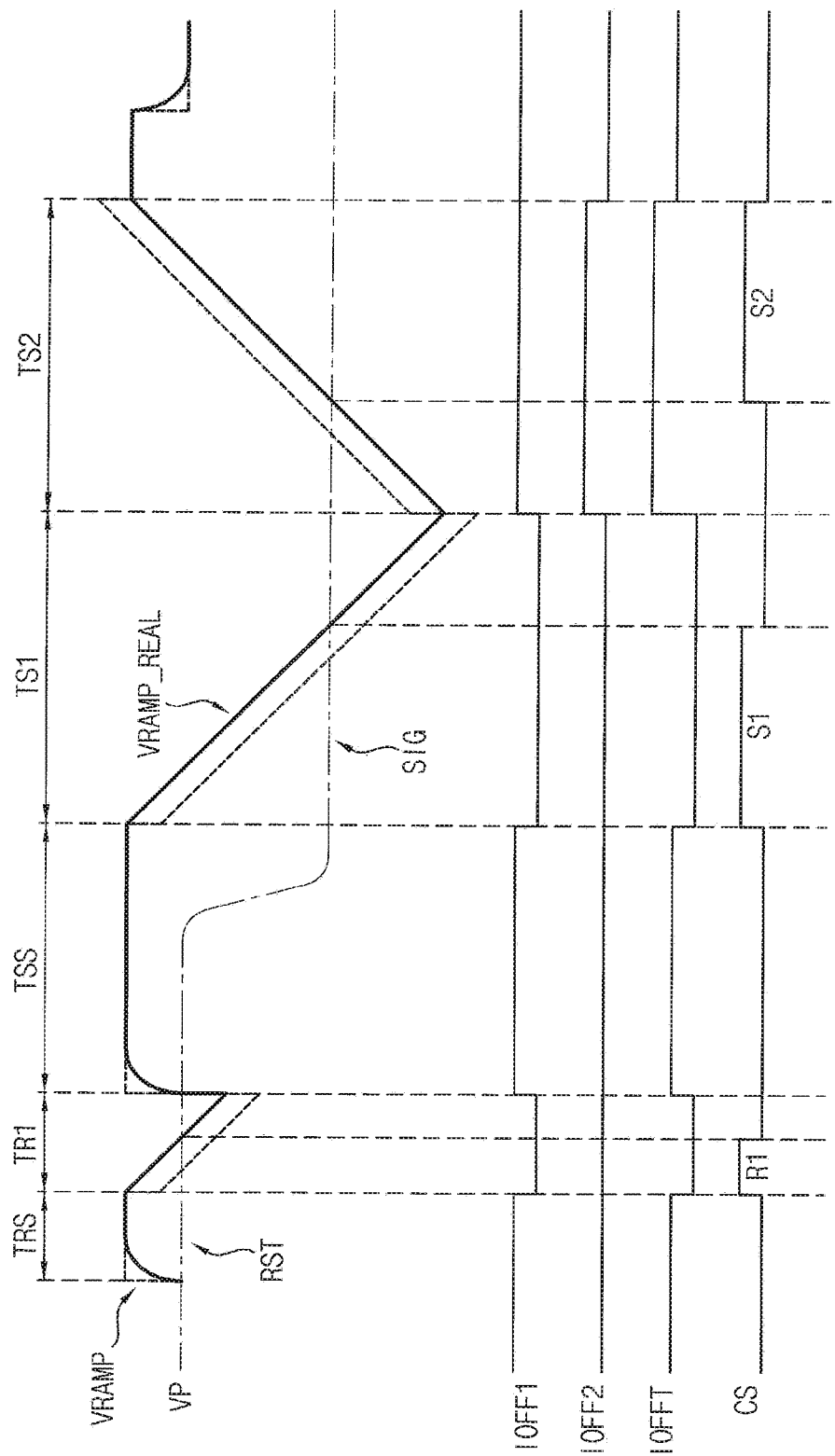
FIG. 21 is a timing diagram for describing an operation of sampling the reset component and the image component of the analog pixel signal in FIGS. 20 and 7.

FIG. 20 is a flowchart illustrating an example of sampling a reset component of an analog pixel signal in FIG. 19. FIG. 21 is a timing diagram for describing an operation of sampling the reset component and the image component of the analog pixel signal in FIGS. 20 and 7. The descriptions repeated with FIGS. 6, 7, 8 and 9 will be omitted.

Referring to FIGS. 2, 7, 19, 20 and 21, an example where the reset component RST of the analog pixel signal VP is sampled once and the image component SIG of the analog pixel signal VP is sampled twice will be described. In other words, example embodiments may also be applied to a case where the number of times of sampling the image component SIG is greater than the number of times of sampling the reset component RST. When sampling the reset component RST of the analog pixel signal VP (step S200), operations in the initial reset time interval TRS and the first reset time interval TR1 and steps S210 and S220 may be substantially the same as those described with reference to FIGS. 6, 7, 8 and 9.

When sampling the image component SIG of the analog pixel signal VP (step S300), operations in the initial image time interval TSS, the first image time interval TS1 and the second image time interval TS2 and steps S310, S320, S330 and S340 may be substantially the same as those described with reference to FIGS. 6, 7, 8 and 9.

Although not illustrated in detail, when generating the digital signal (step S400), the digital signal may be obtained in a manner similar to that described with reference to FIGS. 17 and 18. Moreover, although FIGS. 6 through 18, 20 and 21 illustrate examples where the reset component RST is sampled a predetermined number of times and the image component SIG is sampled a predetermined number of times, example embodiments are not limited thereto. For example, example embodiments may be applied to any image sensor that operates based on a multiple sampling scheme that samples the reset component of the same analog pixel signal any number of multiple times, based on a scheme that samples the image component of the same analog pixel signal any number of multiple times equal to, less than or greater than that of the reset component, and based on the ramp signal in which the level is repeatedly decreased and increased with the constant slope and the offset is repeatedly decreased and increased by the constant magnitude.

In addition, although FIGS. 1 through 21 illustrate examples where the image sensor operates only based on the multiple sampling scheme and the ramp signal in which the level is repeatedly decreased and increased with the constant slope and the offset is repeatedly decreased and increased by the constant magnitude, example embodiments are not limited thereto. For example, the image sensor according to example embodiments may operate in one of various operation modes based on a mode signal. The image sensor may select one of the multiple sampling scheme and a single sampling scheme based on the mode signal, and may determine the number of times of sampling the reset component and the image component in the multiple sampling scheme based on the mode signal.

As will be appreciated by those skilled in the art, inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 22:
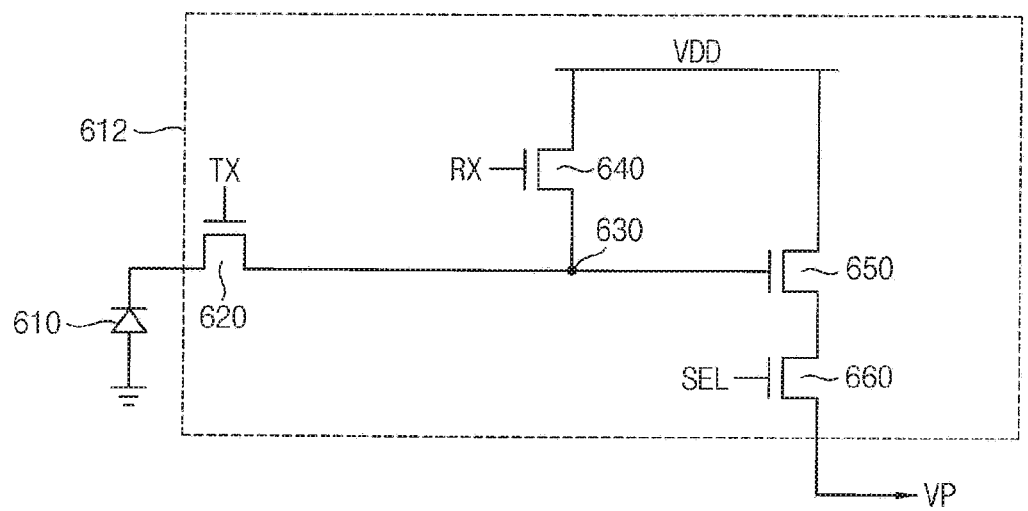
FIG. 22 is a circuit diagram illustrating an example of a unit pixel included in an image sensor according to example embodiments.

FIG. 22 is a circuit diagram illustrating an example of a unit pixel included in an image sensor according to example embodiments. Referring to FIG. 22, a unit pixel 600 may include a photoelectric conversion unit 610 and a signal generation unit 612. The photoelectric conversion unit 610 may perform a photoelectric conversion operation. For example, the photoelectric conversion unit 610 may convert the incident light into photo-charges during an integration mode. If an image sensor including the unit pixel 600 is a CMOS image sensor, image information on an object to be captured may be obtained by collecting charge carriers (e.g., electron-hole pairs) in the photoelectric conversion unit 610 proportional to intensity of the incident light through an open shutter of the CMOS image sensor during the integration mode.

The signal generation unit 612 may generate an electric signal (e.g., an analog pixel signal VP) based on the photo-charges generated by the photoelectric conversion operation during a readout mode. If the image sensor including the unit pixel 600 is the CMOS image sensor, the shutter may be closed, and the analog pixel signal VP may be generated based on the image information in a form of the charge carriers during the readout mode after the integration mode. For example, as illustrated in FIG. 22, the unit pixel 600 may have four-transistor structure including four transistors.

For example, the signal generation unit 612 may include a transfer transistor 620, a reset transistor 640, a drive transistor 650, a selection transistor 660 and a floating diffusion node 630. The transfer transistor 620 may be connected between the photoelectric conversion unit 610 and the floating diffusion node 630, and may include a gate electrode receiving a transfer signal TX. The reset transistor 640 may be connected between a power supply voltage VDD and the floating diffusion node 630, and may include a gate electrode receiving a reset signal RX. The drive transistor 650 may be connected between the power supply voltage VDD and the selection transistor 660, and may include a gate electrode connected to the floating diffusion node 630. The selection transistor 660 may be connected between the drive transistor 650 and an output terminal outputting the analog pixel signal VP, and may include a gate electrode receiving a selection signal SEL.

Hereinafter, an operation of generating the analog pixel signal VP will be described in detail. When an external light is incident onto the photoelectric conversion unit 610 during the integration mode, the photo charges are collected or generated in proportion to the amount of the incident light. During the readout mode after the integration mode, the selection signal SEL is activated, and the signal generation unit 612 is selected in response to the selection signal SEL. After that, the reset signal RX is activated, the reset transistor 640 is turned on in response to the reset signal RX, and an electric potential of the floating diffusion node 630, which is a sensing node, is reset to the power supply voltage VDD. When the reset signal RX is deactivated and the reset operation is completed, the analog pixel signal VP has a reset level (e.g., a level corresponding to the reset component RST in FIG. 8) corresponding to a reset state of the floating diffusion node 630. After that, the transfer signal TX is activated, the transfer transistor 620 is turned on in response to the transfer signal TX, and the photo charges accumulated in the photoelectric conversion unit 610 are transferred to the floating diffusion node 630 via the transfer transistor 620. When the transfer signal TX is deactivated and the charge transfer operation is completed, the analog pixel signal VP has an image level (e.g., a level corresponding to the image component SIG in FIG. 8) corresponding to the incident light (e.g., corresponding to the photo charges accumulated in the photoelectric conversion unit 610).

A configuration of the signal generation unit 612 may be changed according to example embodiments. In addition, although not illustrated in FIG. 22, one signal generation unit may be shared by a plurality of photoelectric conversion units.

Figure 23:
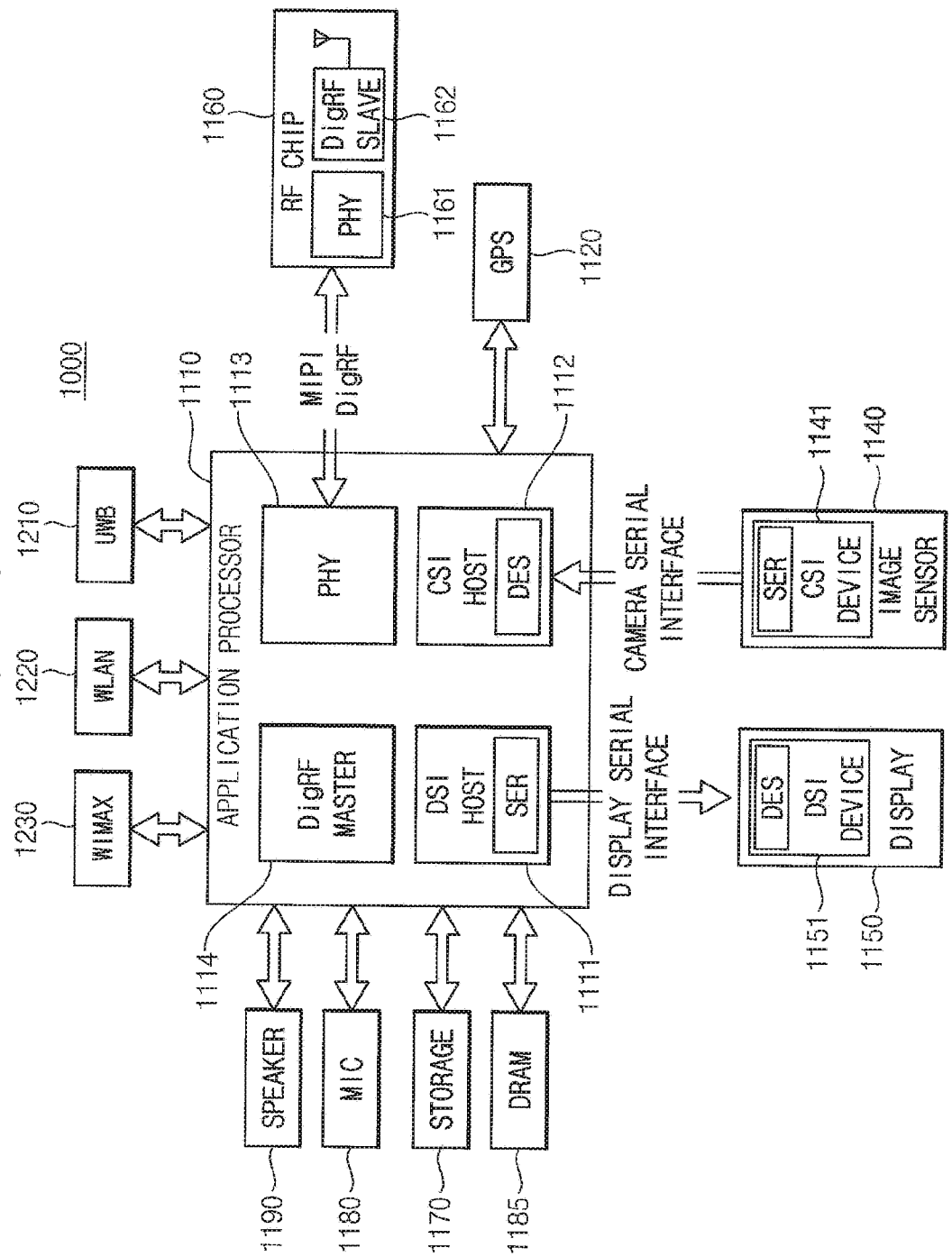
FIG. 23 is a block diagram illustrating an electronic system including an image sensor according to example embodiments.

FIG. 23 is a block diagram illustrating an electronic system including an image sensor according to example embodiments. Referring to FIG. 23, an electronic system 1000 may be implemented as a data processing device that uses or supports a mobile industry processor interface (MIPI) interface. The electronic system 1000 may include an application processor 1110, an image sensor 1140, a display device 1150, etc. The electronic system 1000 may further include a radio frequency (RF) chip 1160, a global positioning system (GPS) 1120, a storage 1170, a microphone (MIC) 1180, a dynamic random access memory (DRAM) 1185 and a speaker 1190. In addition, the electronic system 1000 may perform communications using an ultra wideband (UWB) 1210, a wireless local area network (WLAN) 1220, a worldwide interoperability for microwave access (WIMAX) 1230, etc.

The application processor 1110 may be a controller or a processor that controls an operation of the image sensor 1140. The image sensor 1140 may be the image sensor according to example embodiments, and may perform or execute the method of operating the image sensor according to example embodiments. The application processor 1110 may include a display serial interface (DSI) host 1111 that performs a serial communication with a DSI device 1151 of the display device 1150, a camera serial interface (CSI) host 1112 that performs a serial communication with a CSI device 1141 of the image sensor 1140, a physical layer (PHY) 1113 that performs data communications with a PHY 1161 of the RF chip 1160 based on a MIPI DigRF, and a DigRF MASTER 1114 that controls the data communications of the physical layer 1161. A DigRF SLAVE 1162 of the RF chip 1160 may be controlled through the DigRF MASTER 1114.

In some example embodiments, the DSI host 1111 may include a serializer (SER), and the DSI device 1151 may include a deserializer (DES). In some example embodiments, the CSI host 1112 may include a deserializer (DES), and the CSI device 1141 may include a serializer (SER).

The inventive concept may be applied to various electronic devices and systems including the image sensors. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating an image sensor, comprising:
generating an analog pixel signal comprising a reset component and an image component based on incident light received by a pixel in the image sensor;
sampling the reset component of the analog pixel signal using a ramp signal that is generated by a ramp signal generator having an RC circuit at an output node thereof, during a first time interval; then
sampling the image component of the analog pixel signal using the ramp signal, during a second time interval subsequent to the first time interval;
generating at least one offset signal having a magnitude that changes during the first time interval and during the second time interval; and
generating a digital signal corresponding to an effective image component of the incident light, based on the sampled reset component of the analog pixel signal and the sampled image component of the analog pixel signal;
wherein at least one of said sampling the reset component and said sampling the image component is repeatedly performed;
wherein during at least one of the first time interval and the second time interval, the ramp signal changes between different polarity slopes in response to a change in the magnitude of the at least one offset signal;
wherein: (i) a negative offset in an ideal ramp signal repeatedly decrements by a constant magnitude as a function of time when the ramp signal has a negative polarity slope, and (ii) a positive offset in the ideal ramp signal repeatedly increments by the constant magnitude as a function of time when the ramp signal has a positive polarity slope; and
wherein the ramp signal is generated at the output node of the ramp signal generator by providing the ideal ramp signal as an input to the RC circuit.

2. The method of claim 1, wherein during the first time interval, the ramp signal decreases in magnitude, and then increases in magnitude in response to the change in the magnitude of the at least one offset signal.

3. The method of claim 1, wherein the at least one offset signal includes a first offset signal and second offset signal; wherein during the first time interval, the ramp signal decreases in magnitude at a constant slope and then increases in magnitude at a constant slope, in response to changes in both the first and second offset signals.

4. The method of claim 2, wherein the at least one offset signal includes first and second offset signals; and wherein during the second time interval, the ramp signal decreases in magnitude, and then increases in magnitude in response to changes in both the first and second offset signals.

5. The method of claim 4, wherein said sampling the reset component comprises generating a first count during the first time interval; and wherein said sampling the image component comprises generating a second count during the second time interval.

6. The method of claim 5, wherein the digital signal corresponding to an effective image component of the incident light is proportional to a difference between the first and second counts.

7. The method of claim 4, wherein said sampling the image component comprises generating a digital count having a magnitude proportional to a length of time during which the image component of the analog pixel signal is greater than or less than a magnitude of the ramp signal.

8. The method of claim 4, wherein said sampling the reset component comprises generating a first digital count having a magnitude proportional to a length of time during which the reset component of the analog pixel signal is greater than or less than a magnitude of the ramp signal during the first time interval; and wherein said sampling the image component comprises generating a second digital count having a magnitude proportional to a length of time during which the image component of the analog pixel signal is greater than or less than a magnitude of the ramp signal during the second time interval.

9. The method of claim 8, wherein said generating a first digital count comprises temporarily storing the first digital count in a register; and wherein said generating a second digital count comprises temporarily storing the second digital count in the register.

10. A method of operating an image sensor, the method comprising:
    generating an analog pixel signal including a reset component and an image component based on incident light;
    during a first time interval, sampling the reset component of the analog pixel signal two or more times based on a ramp signal generated by a ramp signal generator having an RC circuit at an output node thereof, a level of the ramp signal decreasing and increasing with a constant slope during the first time interval, in response to a first change in at least one offset signal and a second change in the at least one offset signal, respectively;
    during a second time interval subsequent to the first time interval, sampling the image component of the analog pixel signal based on the ramp signal; and
    generating a digital signal corresponding to an effective image component of the incident light based on the sampled reset component and the sampled image component;
    wherein: (i) a negative offset in an ideal ramp signal repeatedly decrements by a constant magnitude as a function of time when the ramp signal has a negative polarity slope, and (ii) a positive offset in the ideal ramp signal repeatedly increments by the constant magnitude as a function of time when the ramp signal has a positive polarity slope; and
    wherein the ramp signal is generated at the output node of the ramp signal generator by providing the ideal ramp signal as an input to the RC circuit.

11. The method of claim 10, wherein sampling the reset component two or more times includes:
    during a first reset time interval, decreasing the offset of the ramp signal by the constant magnitude with respect to an initial offset while falling the level of the ramp signal with the constant slope;
    during the first reset time interval, obtaining a first reset sampling value representing the reset component based on a first time point at which the ramp signal crosses the analog pixel signal;
    during a second reset time interval subsequent to the first reset time interval, increasing the offset of the ramp signal by the constant magnitude with respect to the initial offset while increasing the level of the ramp signal with the constant slope; and
    during the second reset time interval, obtaining a second reset sampling value representing the reset component based on a second time point at which the ramp signal crosses the analog pixel signal.

12. The method of claim 11, wherein sampling the reset component two or more times further includes:
    during a third reset time interval subsequent to the second reset time interval, decreasing the offset of the ramp signal by the constant magnitude with respect to the initial offset while falling the level of the ramp signal with the constant slope; and
    during the third reset time interval, obtaining a third reset sampling value representing the reset component based on a third time point at which the ramp signal crosses the analog pixel signal.

13. The method of claim 12, wherein sampling the reset component two or more times further includes:
    during a fourth reset time interval subsequent to the third reset time interval, increasing the offset of the ramp signal by the constant magnitude with respect to the initial offset while increasing the level of the ramp signal with the constant slope; and
    during the fourth reset time interval, obtaining a fourth reset sampling value representing the reset component based on a fourth time point at which the ramp signal crosses the analog pixel signal.

14. The method of claim 11, wherein a difference between the level of the ramp signal at an end point of the first reset time interval and the level of the ramp signal at a start point of the second reset time interval is equal to twice the constant magnitude.

15. The method of claim 10, wherein a number of times of sampling the image component is less than or equal to a number of times of sampling the reset component.

16. The method of claim 10, wherein sampling the image component includes:
    during a first image time interval, decreasing the offset of the ramp signal by the constant magnitude with respect to an initial offset while falling the level of the ramp signal with the constant slope; and
    during the first image time interval, obtaining a first image sampling value representing the image component based on a first time point at which the ramp signal crosses the analog pixel signal.

17. The method of claim 16, wherein sampling the image component further includes:
    during a second image time interval subsequent to the first image time interval, increasing the offset of the ramp signal by the constant magnitude with respect to the initial offset while increasing the level of the ramp signal with the constant slope; and
    during the second image time interval, obtaining a second image sampling value representing the image component based on a second time point at which the ramp signal crosses the analog pixel signal.

18. The method of claim 17, wherein sampling the image component further includes:
during a third image time interval subsequent to the second image time interval, decreasing the offset of the ramp signal by the constant magnitude with respect to the initial offset while falling the level of the ramp signal with the constant slope; and
during the third image time interval, obtaining a third image sampling value representing the image component based on a third time point at which the ramp signal crosses the analog pixel signal.

19. A method of operating an image sensor, the method comprising:
generating an analog pixel signal including a reset component and an image component based on incident light;
during a first time interval, sampling the reset component of the analog pixel signal based on a ramp signal that changes slope polarity in-sync with a change in at least one offset signal generated by at least one offset generator, said ramp signal generated by a ramp signal generator having an RC circuit at an output thereof;
during a second time interval subsequent to the first time interval, sampling the image component of the analog pixel signal two or more times based on the ramp signal, a level of the ramp signal decreasing and increasing with a constant slope during the second time interval; and
generating a digital signal corresponding to an effective image component of the incident light based on the sampled reset component and the sampled image component;
wherein: (i) a negative offset in an ideal ramp signal repeatedly decrements by a constant magnitude as a function of time when the ramp signal has a negative polarity slope, and (ii) a positive offset in the ideal ramp signal repeatedly increments by the constant magnitude as a function of time when the ramp signal has a positive polarity slope; and
wherein the ramp signal is generated at the output node of the ramp signal generator by providing the ideal ramp signal as an input to the RC circuit.

* * * * *